(12) United States Patent
Kasai et al.

(10) Patent No.: US 7,854,962 B2
(45) Date of Patent: Dec. 21, 2010

(54) GAS SUPPLY METHOD USING A GAS SUPPLY SYSTEM

(75) Inventors: Shigeru Kasai, Nirasaki (JP); Sum Tanaka, Nirasaki (JP); Tetsuya Saito, Nirasaki (JP); Norihiko Yamamoto, Nirasaki (JP); Kenichi Yanagitani, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 36 days.

(21) Appl. No.: 12/320,197

(22) Filed: Jan. 21, 2009

(65) Prior Publication Data

US 2009/0133755 A1    May 28, 2009

Related U.S. Application Data

(62) Division of application No. 10/525,207, filed on Mar. 14, 2006, now abandoned.

(51) Int. Cl.
*C23C 16/448* (2006.01)
(52) U.S. Cl. .............. 427/248.1; 427/252; 427/255.28
(58) Field of Classification Search .............. 427/248.1, 427/252, 255.28
See application file for complete search history.

(56) References Cited

U.S. PATENT DOCUMENTS

| | | | | |
|---|---|---|---|---|
| 3,944,684 A | * | 3/1976 | Kane et al. | 427/109 |
| 4,436,674 A | * | 3/1984 | McMenamin | 261/64.3 |
| 5,019,531 A | | 5/1991 | Awaya et al. | |
| 5,045,357 A | * | 9/1991 | Motonaga et al. | 427/255.14 |
| 5,055,280 A | * | 10/1991 | Nakatani et al. | 423/276 |
| 5,175,017 A | * | 12/1992 | Kobayashi et al. | 427/8 |
| 5,326,717 A | * | 7/1994 | Imaizumi et al. | 438/572 |
| 5,520,858 A | | 5/1996 | Yamaguchi et al. | |
| 5,614,026 A | | 3/1997 | Williams | |
| 5,741,615 A | * | 4/1998 | Saitoh et al. | 430/58.1 |
| 5,891,253 A | | 4/1999 | Wong et al. | |
| 5,902,651 A | | 5/1999 | Westmoreland et al. | |
| 5,989,345 A | | 11/1999 | Hatano | |
| 6,126,994 A | * | 10/2000 | Murakami et al. | 427/248.1 |
| 6,424,800 B1 | | 7/2002 | Kim | |
| 6,442,736 B1 | | 8/2002 | Girard et al. | |
| 6,482,266 B1 | | 11/2002 | Matsumoto et al. | |
| 6,499,425 B1 | | 12/2002 | Sandhu et al. | |
| 6,772,072 B2 | | 8/2004 | Ganguli et al. | |
| 2001/0017103 A1 | | 8/2001 | Takeshita et al. | |
| 2001/0027843 A1 | | 10/2001 | Komino et al. | |
| 2002/0067917 A1 | | 6/2002 | Takamatsu et al. | |
| 2003/0042630 A1 | | 3/2003 | Babcoke et al. | |
| 2004/0025370 A1 | | 2/2004 | Guenther | |

FOREIGN PATENT DOCUMENTS

| | | | |
|---|---|---|---|
| DE | 1521243 | * | 7/1970 |
| EP | 04099279 | | 3/1992 |
| EP | 07018449 | | 1/1995 |
| EP | 1 079 001 | | 2/2001 |
| EP | 1 211 333 | | 6/2002 |
| JP | 60-149773 | * | 8/1985 |
| JP | 2-124796 | | 5/1990 |
| JP | 2002-124796 | | 5/1990 |
| JP | 2-256238 | | 10/1990 |
| JP | 04-99279 | | 3/1992 |
| JP | 04-369833 | | 12/1992 |
| JP | 2005-009740 | | 1/1993 |
| JP | 06-196414 | | 7/1994 |
| JP | 07-18449 | | 1/1995 |
| JP | 2000-122725 | | 4/2000 |
| JP | 2001-68465 | | 3/2001 |
| JP | 2001-073145 | | 3/2001 |
| JP | 2001-131754 | | 5/2001 |
| JP | 2003-197613 | | 7/2003 |
| WO | WO 94/06529 | | 3/1994 |
| WO | 01/61071 A2 | | 8/2001 |

OTHER PUBLICATIONS

International Preliminary Examination Report (PCT/IPEA/409) (translated) issued for PCT/JP2003/01075.
Notification of Transmittal of Translation of the International Preliminary Examination Report (PCT/IB/338) issued for PCT/JP2003/01075.
European Patent Office, Supplementary European Search Report dated Jun. 4, 2007 for corresponding European Application 03 79 2832.

* cited by examiner

*Primary Examiner*—Bret Chen
(74) *Attorney, Agent, or Firm*—Smith, Gambrell & Russell, LLP

(57) ABSTRACT

Disclosed herein is a processing system that can supply a material gas produced inside a material reservoir tank into a processing apparatus while generating almost no pressure loss. The processing system has a processing apparatus including a gas injection injector for injecting a specific material gas into a processing vessel in order to provide specific processing to an object to be processed W, the material gas being produced from a metallic compound material M with low vapor pressure; and a gas supply system for supplying the specific material gas to the gas injector, the gas injector is a shower head portion and the gas supply system provides: a gas passage extending upwardly from the showerhead portion; a material reservoir tank attached to the upper-end portion of the gas passage for containing the metallic compound material therein; and an open/close valve for opening/closing the gas passage.

9 Claims, 16 Drawing Sheets

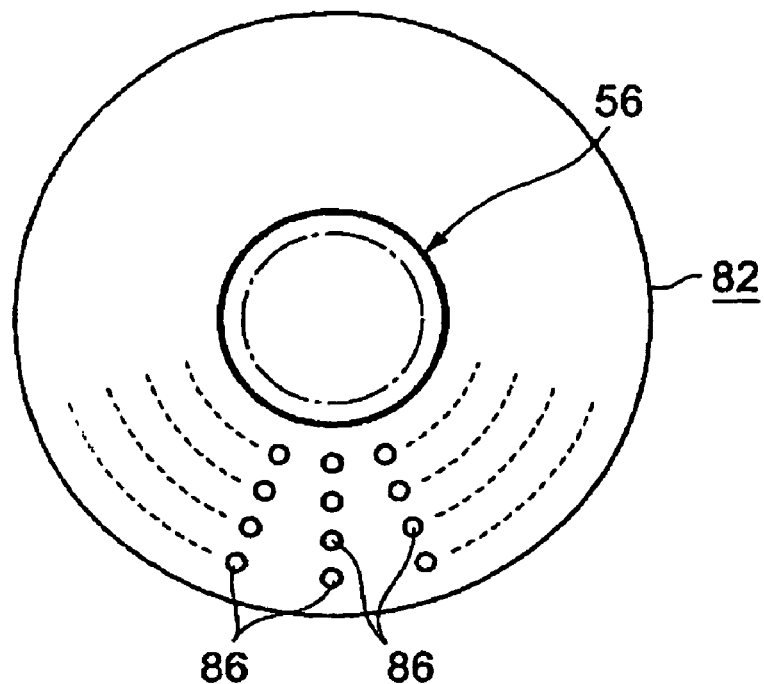
F I G. 2
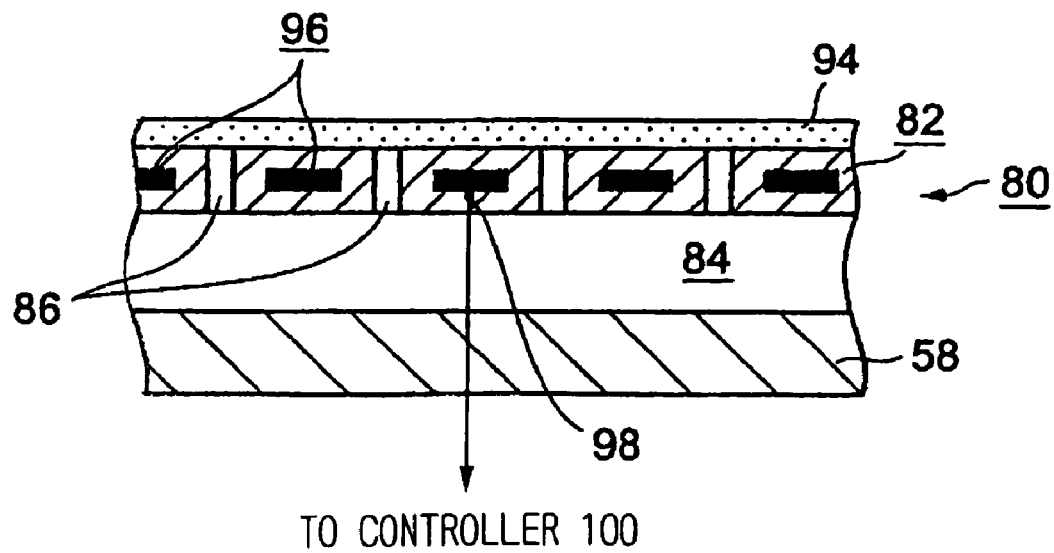
F I G. 3

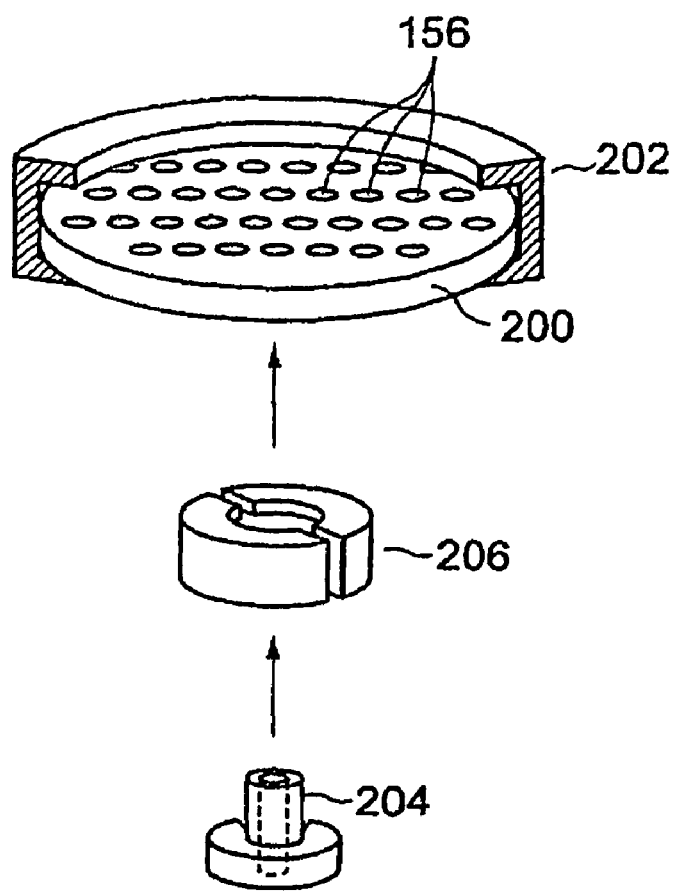
F I G. 13
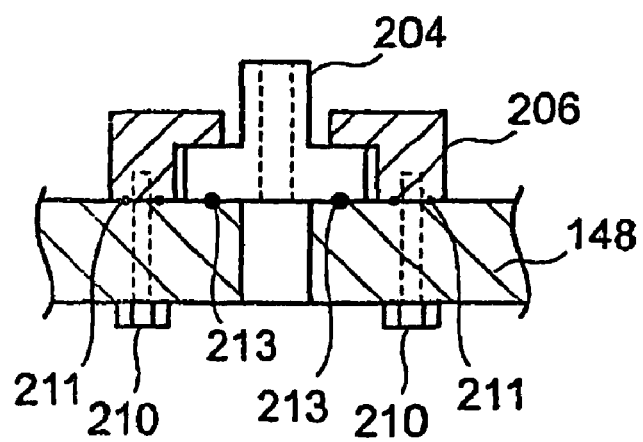
F I G. 14

US 7,854,962 B2

GAS SUPPLY METHOD USING A GAS SUPPLY SYSTEM

CROSS REFERENCE TO RELATED APPLICATION

This is a division of application Ser. No. 10/525,207 filed Mar. 14, 2006 now abandoned, which is incorporated in its entirety herein by reference.

FIELD OF INVENTION

The present invention relates to a processing system that provides specific processing to an object to be processed such as a semiconductor wafer and a gas supply line that supplies processing gas.

BACKGROUND OF THE INVENTION

In general manufacturing of semiconductor devices, repetitious processes of film formation and pattern etching are provided on semiconductor wafers to manufacture intended devices. Every year the demands particularly for high specifications of the film formation technique are growing as semiconductor devices became highly densified and integrated, and further reduction in the thickness of the film has been required to form quite thin oxide films, such as insulating films and gate-insulating films in a capacitor in the device for example, in which high insulating ability is also required.

Silicon oxide films and silicon nitride films can be used for these insulating films, but more metal oxide films are recently chosen as material with better insulating properties. The metal oxide films, providing highly reliable insulating ability in spite of their thinness, can provide further improved insulating ability by applying modification processing on the surface after the metal oxide film formation is completed.

Metal nitride films are also more often adopted as material with favorable ability for barrier metal layers, etc. In association with the above-mentioned metal oxide films and metal nitride films, metallic compound material has come into wide use as a material gas at the film formation. The metallic compound material generally is liquid or solid at normal temperature and pressure, and has characteristics to be hardly evaporated or sublimed for its relatively low vapor pressure.

The gas supply system of a material gas produced from metallic compound material is hereinafter explained. FIG. 21 is a structural block diagram showing a conventional gas supply system of a material gas composed of metallic compound material.

As shown in FIG. 21, the metallic compound material M composed of liquid or solid organic metal material or the like is contained in a material reservoir tank 2 into which a carrier gas, e.g. Ar gas, is fed while a flow controller 4 controls the flow rate, thereby promoting evaporation or sublimation of the metallic compound material. The material gas produced by evaporation or sublimation of the metallic compound material is carried with the carrier gas to a processing apparatus 8 through a gas passage 6 and supplied into the processing apparatus 8 with other necessary gas in order to deposit a specific thin film on the surface of a semiconductor wafer W that is an object to be processed. In addition, a heater 10 may be provided at the material reservoir tank 2 as necessary so that evaporation of the metallic compound material is promoted.

SUMMARY OF THE INVENTION

In the gas supply system described above on the other hand, the material reservoir tank 2 and the processing apparatus 8 are wide apart and thus the length of the pipe of the gas passage 6 is elongated, resulting in quite an increase in pressure loss at this point. Consequently, there has been difficulty in obtaining a material gas of a desired flow amount because the pressure inside the material reservoir tank 2 is increased corresponding to the pressure loss values, thus decreasing the evaporation or sublimation of the metallic compound material M correspondingly.

In this case, the metallic compound material M might possibly be placed inside the processing apparatus in a case that the metallic compound material M is solid, but this is not practical because the produced material gas flow cannot be controlled.

Moreover, especially in a case that the metallic compound material M is solid, there has been a problem that the flow amount of the produced material gas becomes unstable because an injection nozzle 12 for a carrier gas is provided inside the material reservoir tank 2 and is directed fixably at a specific point, thereby subliming and decreasing the particular part of the metallic compound material M having a direct contact with the gas injected from the injection nozzle 12 while the other part has less decrease, resulting in causing one-side wear.

The present invention has been made in the light of the above-mentioned problems to be solved effectively.

The first object of the present invention is to provide a gas supply system that can uniformly maintain the flow amount of a material gas produced from metallic compound material inside the material reservoir tank.

The second object of the present invention is to provide a processing system that can supply a material gas produced inside the material reservoir tank into the processing apparatus while generating almost no pressure loss.

The present invention is a gas supply system for supplying a specific material gas into a processing apparatus in order to provide specific processing to an object to be processed wherein said material gas is produced from metallic compound material with low vapor pressure, said system characterized by comprising: a gas passage extending to said processing apparatus; a material reservoir tank attached to one end of said gas passage for containing said metallic compound material therein; and a first carrier gas supply means connected to said material reservoir tank into which a carrier gas is fed, wherein said first carrier gas supply means comprises a gas diffusion chamber provided in a bottom portion of said material reservoir tank, and a gas injection plate separating said gas diffusion chamber and having a number of gas injection holes.

In this manner a material gas is obtained as a result of evaporating metallic compound material by injecting a carrier gas from the whole surface of the bottom portion of the material reservoir tank, and the produced material gas flow can thus be maintained at a constant amount.

In addition, the produced material gas flow can be controlled with high accuracy by changing the supplying flow amount of the carrier gas.

In this case, a porous fluorinated resin layer is provided on a gas injection surface of said gas injection plate, as in another invention of the present application.

In this manner the liquid or solid metallic compound material can be prevented from flowing downwardly into the diffusion chamber below.

Moreover, said gas injection plate is formed by porous fluorinated resin, as in another invention of the present application.

Furthermore, a material heating means is provided in said material reservoir tank for heating said metallic compound material, as in another invention of the present application.

In this manner the evaporation of the metallic compound material can be promoted due to the material heating means.

In this case, said material heating means is provided in the bottom portion of said material reservoir tank, as in another invention of the present application.

Moreover, said material heating means is implanted in said gas injection plate, as in another invention of the present application.

Furthermore, said gas injection plate comprises a shower portion having a number of gas injection holes, wherein said shower portion is supported by support members on said bottom portion, each of the support members having a hollow portion inside, and each of said hollow portion provides atmospheric air as in another invention of the present application.

Another invention of the present invention is a processing system comprising: a processing apparatus including a gas injection means for injecting a specific material gas into a processing vessel in order to provide specific processing to an object to be processed, said material gas being produced from metallic compound material with low vapor pressure; and a gas supply system for supplying said specific material gas to said gas injection means, wherein: said gas injection means is a showerhead portion; and said gas supply system is characterized by comprising: a gas passage extending upwardly from said showerhead portion; a material reservoir tank attached to an upper-end portion of said gas passage for containing said metallic compound material therein; and an open/close valve for opening/closing said gas passage.

In this manner the material reservoir tank is provided and directly attached to the processing vessel in the upper area of the processing apparatus, linked by the gas passage, and thus almost no pressure loss is generated during the material gas delivery, and the material gas can be effectively produced and effectively fed into the processing apparatus as a result.

In this case, said upper-end portion of said gas passage is inserted in said material reservoir tank and said open/close valve is provided for opening/closing an opening of the upper-end portion of said gas passage, as in another invention of the present application.

Moreover, said open/close valve is intermediately inserted in said gas passage, as in another invention of the present application.

Furthermore, a first carrier gas supply means is provided in said material reservoir tank for feeding a carrier gas in said material reservoir tank, as in another invention of the present application.

In addition, said first carrier gas supply means comprises: a gas diffusion chamber provided in a bottom portion of said material reservoir tank; and a gas injection plate separating said gas diffusion chamber and having a number of gas injection holes, as in another invention of the present application.

In this manner the produced material gas flow can be maintained at a constant amount because the carrier gas is designed to be injected from the whole surface of the bottom portion of the material reservoir tank in order to evaporate the metallic compound material so as to obtain the material gas.

In addition, the produced material gas flow amount can be controlled with high accuracy by changing the supplying flow amount of the carrier gas.

Moreover, a porous fluorinated resin layer is provided on a gas injection surface of said gas injection plate, as in another invention of the present application.

In this manner the liquid or solid metallic compound material can be prevented from flowing downwardly into the diffusion chamber below.

Moreover, said gas injection plate is formed by porous fluorinated resin, as in another invention of the present application.

Furthermore, a material heating means is provided in said material reservoir tank for heating said metallic compound material, as in another invention of the present application.

In this manner the evaporation of the metallic compound material can be promoted due to the material heating means.

Moreover, said material heating means is provided in said bottom portion of said material reservoir tank, as in another invention of the present application.

Furthermore, said material heating means is implanted in said gas injection plate, as in another invention of the present application.

In addition, a purge gas feed pipe is provided in the proximity of said showerhead portion for feeding a purge gas in said showerhead portion, as in another invention of the present application.

Besides, the processing system comprises: a temperature detecting means for detecting the temperature of said material heating means; and a controller for controlling said material heating means so that a value detected by said temperature detecting means is maintained around a specific value, as in another invention of the present application.

In this manner the material gas flow can be maintained at a specific amount with high accuracy because the temperature of the material heating means is detected and the detected value is maintained around a specific value.

Moreover, the processing system comprises: a pressure detecting means for detecting the pressure inside said gas passage or said material reservoir tank; and a controller for controlling said material heating means so that a value detected by said pressure detecting means is maintained around a specific value, as in another invention of the present application.

In this manner the material gas flow can be maintained at a specific amount with high accuracy because the pressure inside the gas passage is detected to control the material heating means.

Moreover, the processing system comprises: an orifice means provided inside said gas passage for providing a sonic nozzle condition; a pressure detecting means for detecting pressure at an upstream side of the orifice means; and a controller for controlling said material heating means or said first carrier gas supply means so that a value detected by said pressure detecting means is maintained around a specific value, as in another invention of the present application.

In this manner the material gas flow can be maintained around a specific amount with high accuracy because the orifice means is provided to provide a sonic nozzle condition and the heat release amount of the material heating means and/or the supplying flow amount of the carrier gas are/is controlled so that the pressure inside the gas passage on the upstream side of the orifice means is maintained around a specific value.

Moreover, the processing system comprises: a partial pressure detecting means for detecting the partial pressure of a material gas inside said gas passage or material reservoir tank, said material gas being produced from the metallic compound material; and a controller for controlling said material heating means so that a value detected by said partial pressure detecting means is maintained around a specific value, as in another invention of the present application.

In this manner the material gas flow can be maintained around a specific amount with high accuracy because the partial pressure of the material gas inside the gas passage is detected and the heat release amount of the material heating means is controlled in order to maintain the detected pressure around a specific value.

Moreover, the processing system comprises: a gas flow detecting means for detecting the amount of gas flowing through said gas passage; and a controller for controlling said material heating means so that a value detected by said gas flow detecting means is maintained around a specific value, as in another invention of the present application.

In this manner the material gas flow can be maintained around a specific amount with high accuracy because the gas flow amount inside the gas passage is detected and the heat release amount of the material heating means is controlled in order to maintain the detected amount around a specific value.

Moreover, the processing system comprises: a second carrier gas supply means connected to said gas passage; a gas flow detecting means provided at said gas passage on a downstream side of a connection point of said second carrier gas supply means and said gas passage for detecting the gas flow amount flowing through said gas passage; and a controller for controlling the gas flow amount of each of said first and second carrier gas supply means so that the flow amount of a material gas within said gas flow is maintained at a constant amount, said material gas being produced from said metallic compound material, as in another invention of the present application.

In this manner the material gas flow can be maintained around a specific amount with high accuracy because the second carrier gas supply means is provided wherein the amount of the gas flowing inside the gas flow path is detected and the first carrier gas supply means is so controlled as to always maintain a constant flow amount of the material gas carried by the carrier gas from the first carrier gas supply means, and then the flow amount of the carrier gas increased or decreased by this control is compensated by the carrier gas from the second carrier gas supply means in order to constantly supply a specific amount of the total gas flow to the processing apparatus.

Moreover, material heating means are provided at the bottom portion, a side portion and a ceiling portion of said material reservoir tank respectively and said material heating means can be controlled separately, as in another invention of the present application.

Furthermore, yet another invention of the present application is a processing system comprising: a processing apparatus including a gas injection means for injecting a specific material gas into a processing vessel in order to provide specific processing to an object to be processed, said material gas being produced from metallic compound material with low vapor pressure; and a gas supply system for supplying said specific material gas to said gas injection means, wherein said gas supply system is characterized by comprising: a material reservoir tank for containing said metallic compound material therein; a gas passage for connecting said material reservoir tank to said gas injection means of said processing vessel; a first carrier gas supply means connected to said material reservoir tank for feeding a carrier gas therein; a material heating means provided at said material reservoir tank for heating metallic compound material inside said material reservoir tank; a detecting means for detecting the conditions inside said gas passage or said material reservoir tank; and a controller for a control for a value detected by said detecting means to be maintained around a specific value.

In this case, said detecting means is a temperature detecting means for detecting the temperature of said material heating means and said controller controls said material heating means so that a value detected by said temperature detecting means is maintained around a specific value, as in another invention of the present application.

In this manner the material gas flow can be maintained around a specific amount with high accuracy because the temperature of the material heating means is detected and the detected value is maintained around a specific value.

Alternatively, said detecting means is a pressure detecting means for detecting the pressure inside said gas passage or said material reservoir tank and said controller controls said material heating means so that a value detected by said pressure detecting means is maintained around a specific value, as in another invention of the present application.

In this manner the material gas flow can be maintained around a specific amount with high accuracy because the pressure inside the gas passage is detected to control the material heating means.

Alternatively, an orifice means is provided inside said gas passage to provide a sonic nozzle condition, said detecting means is a pressure detecting means for detecting pressure at an upstream side of said orifice means, and said controller controls said material heating means or said first carrier gas supply means so that a value detected by said pressure detecting means is maintained around a specific value, as in another invention of the present application.

In this manner the material gas flow can be maintained around a specific amount with high accuracy because the orifice means is provided to provide a sonic nozzle condition and the heat release amount of the material heating means and/or the supplying flow amount of the carrier gas are/is controlled so that the pressure inside the gas passage on the upstream side of the orifice means is maintained around a specific value.

Alternatively, said detecting means is a partial pressure detecting means for detecting the partial pressure of a material gas inside said gas passage or said material reservoir tank, said material gas being produced from metallic compound material, and said controller controls said material heating means so that a value detected by said partial pressure detecting means is maintained around a specific value, as in another invention of the present application.

In this manner the material gas flow can be maintained around a specific amount with high accuracy because the partial pressure of the material gas inside the gas passage is detected and the heat release amount of the material heating means is controlled in order to maintain the detected pressure around a specific value.

Alternatively, said detecting means is a gas flow detecting means for detecting the gas flow amount flowing through said gas passage and said controller controls said material heating means so that a value detected by said gas flow detecting means is maintained around a specific value, as in another invention of the present application.

In this manner the material gas flow can be maintained around a specific amount with high accuracy because the gas flow amount inside the gas passage is detected and the heat release amount of the material heating means is controlled in order to maintain the detected amount around a specific value.

Alternatively, a second carrier gas supply means is connected to said gas passage, said detecting means is a gas flow detecting means provided at said gas passage on a downstream side of a connection point of said second carrier gas supply means and said gas passage for detecting the gas flow amount flowing through said gas passage, and said controller controls the gas flow amount of each of said first and second carrier gas supply means so that the flow amount of a material gas within said gas flow is maintained at a constant amount, said material gas being produced from said metallic compound material, as in another invention of the present application.

In this manner the material gas flow can be maintained around a specific amount with high accuracy because the second carrier gas supply means is provided wherein the amount of the gas flowing inside the gas flow path is detected and the first carrier gas supply means is so controlled as to always maintain a constant flow amount of the material gas carried by the carrier gas from the first carrier gas supply means, and then the flow amount of the carrier gas increased or decreased by this control is compensated by the carrier gas from the second carrier gas supply means in order to constantly supply a specific amount of the total gas flow to the processing apparatus.

In this case, said first carrier gas supply means comprises: a gas diffusion chamber provided in a bottom portion of said material reservoir tank; and a gas injection plate separating said gas diffusion chamber and having a number of gas injection holes, as in another invention of the present application.

In this manner the produced material gas flow can be maintained at a constant amount because the carrier gas is designed to be injected from the whole surface of the bottom portion of the material reservoir tank in order to evaporate the metallic compound material so as to obtain the material gas.

In addition, the produced material gas flow amount can be controlled with high accuracy by changing the supplying flow amount of the carrier gas.

In this case, a porous fluorinated resin layer is provided on the gas injection surface of said gas injection plate, as in another invention of the present application.

In this manner the liquid or solid metallic compound material can be prevented from flowing downwardly into the diffusion chamber below.

In this case, said gas injection plate is formed by porous fluorinated resin, as in another invention of the present application.

In this case, material heating means are provided at the bottom portion, a side portion and a ceiling portion of said material reservoir tank respectively and said material heating means can be controlled separately, as in another invention of the present application.

Moreover, a gas outlet to which said gas passage is connected is provided in the ceiling portion of said material reservoir tank and a baffle plate member is provided to cover said gas outlet in order to prevent any metallic compound material other than gas from entering inside said gas outlet, as in another invention of the present application.

By providing the baffle plate member at the gas outlet in this way, the metallic compound material in the form of droplets or particles/powdery material except for gas can be prevented from flowing to the side of the processing apparatus without generating pressure loss.

In this case, said baffle plate member is provided in a configuration that a surface of said metallic compound material cannot directly be seen from said gas outlet, as in another invention of the present application.

Moreover, said baffle plate member is made of a material with good heat conductance, as in another invention of the present application.

Furthermore, said baffle plate member is provided with an inclination relative to the horizontal, as in another invention of the present application.

In addition, said baffle plate member is constituted by a bending plate in a form of U-shape in cross-section, as in another invention of the present application.

Besides, two plates with different dimensions are provided as said bending plate and said two plates of bending plates are partially mutually inserted to fit together, as in another invention of the present application.

Moreover, said baffle plate member is constituted by a disc plate, as in another invention of the present application.

BRIEF DESCRIPTION OF THE DRAWINGS

FIG. 2 is a plan view showing a gas injection plate.

FIG. 3 is an enlarged, partial, cross-sectional view showing a first carrier gas supply means at the bottom of a material reservoir tank.

FIG. 13 is an exploded diagram showing a part of the first carrier gas supply means at the bottom of the material reservoir tank.

FIG. 14 is an enlarged cross-sectional view showing a configuration of the members of the part shown in FIG. 13.

DETAILED DESCRIPTION OF THE INVENTION

With reference to the attached figures, an embodiment of the gas supply system and processing system according to the present invention will be hereinafter explained in detail.

(First Invention)

Figure 1:
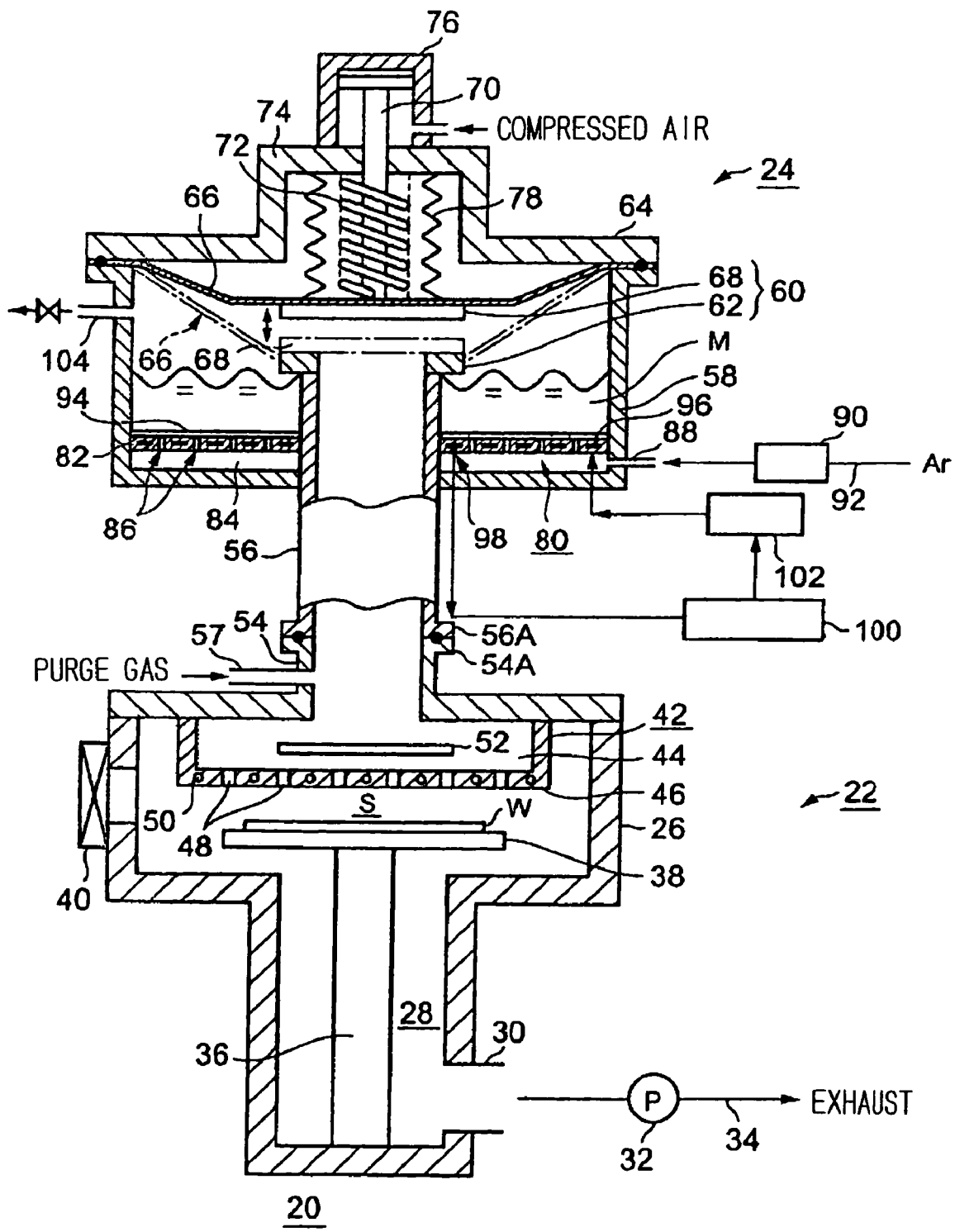
FIG. 1 is a cross-sectional block diagram showing a first invention of a processing system having a gas supply system according to the present invention.

A first invention will be explained firstly. FIG. 1 is a cross-sectional block diagram showing the first invention of the processing system having a gas supply system according to the present invention, FIG. 2 is a plan view showing a gas injection plate, and FIG. 3 is an enlarged, partial, cross-sectional view showing a first carrier gas supply means at the bottom of a material reservoir tank.

As shown in FIG. 1, this processing system 20 mainly comprises a processing apparatus 22 for directly performing predetermined processing onto an object to be processed such as a semiconductor wafer, and a gas supply system 24 for supplying gas necessary for the aforementioned processing into the processing apparatus 22.

The processing apparatus 22 has a processing vessel 26 which is shaped to have a substantially cylindrical body of aluminum or the like for example, and the center of the bottom portion thereof is cylindrically downwardly extended to form a exhaust space 28. In the sidewall defining this exhaust space 28A, a large-diameter vent 30 is formed and connected to an exhaust line 34 with a vacuum pump 32 intermediately inserted therebetween so that the processing vessel 26 can be vacuumed.

Inside the processing vessel 26, a susceptor 38, incorporating a heater for example, is provided on a supporting column 36 uprising from the bottom portion of the exhaust space 28, and a semiconductor wafer W can be mounted on the upper surface of this susceptor 38. On the sidewall of the processing vessel 26, a gate valve 40 is attached and is opened/closed when the wafer W is loaded or unloaded.

As a gas injection means, a showerhead portion 42 for example is provided on the ceiling part of the processing vessel 26, opposed to the susceptor 38. This showerhead portion 42 defines a box-shaped diffusion chamber 44, and a number of gas holes 48 are formed in an injection plate 46 which outlines the lower surface of this diffusion chamber 44 so as to inject specific gas into a processing space S below the gas holes 48.

Inside the injection plate 46, a cooling water passage 50 is implanted for flowing cooling water so that films are not deposited on this part. In addition, a substantially circular diffusion plate 52 is placed inside the diffusion chamber 44 for promoting diffusion of a material gas fed from above the diffusion chamber 44. In this instance, the conductance inside the diffusion chamber 44 is preferably set as high as possible to provide a condition that a material gas can be diffused in a molecular flow region inside the diffusion chamber 44. Note that a gas feed opening (not shown) is formed in the showerhead portion 42 for any necessary gas such as N2 gas and oxidation gas for purging or a reduction gas, other than the material gas to be hereinafter described.

In the substantial center of the ceiling part of the showerhead portion 42, a gas feed opening 54 with a relatively large diameter is formed opening upwardly to which the aforementioned gas supply system 24 is directly interconnected.

To be more precise, this gas supply system 24 mainly comprises: a gas passage 56 extending upwardly from the showerhead portion 42; a material reservoir tank 58 provided at the upper-end portion of this gas passage 56; and an open/close valve 60 for opening and closing this gas passage 56.

The gas passage 56 is a pipe made of aluminum or stainless steel for example, whose internal diameter is set quite large, e.g. approximately 40 mm, to achieve higher exhaust conductance, thus decreasing pressure loss generation as much as possible.

A flange portion 56A on the lower-end portion of this gas passage 56 is joined to a flange portion 54A on the upper-end portion of the gas feed opening 54 via a sealing member, e.g. a bolt (not shown), and the gas passage 56 is uprisen. In the lower part of this flange portion 56A, a purge gas feed pipe 57 is provided for feeding inert gas as a purge gas, such as Ar gas, into the interior of the showerhead portion 42.

The aforementioned material reservoir tank 58 is formed as a cylindrical container of aluminum, stainless steel or the like for example, and is secured in a configuration that the upper portion of the gas passage 56 pierces through the substantial center of the bottom portion of the material reservoir tank 58 to be inserted therein. The upper-end portion of this gas passage 56 is located at the intermediate height of the interior of the material reservoir tank 58 and is constituted as a circular valve seat 62. This material reservoir tank 58 contains inside metallic compound material M that is liquid or solid at the room temperature, e.g. organic metal material.

The ceiling of this material reservoir tank 58 is sealed by a ceiling board 64 via a sealing member. Across the whole inner surface of this ceiling board 64, a diaphragm 66 is inserted airtightly which is a bendable and deformable thin metal plate made of stainless steel or the like for example, and at the center of the lower surface of this diaphragm 66, a valve body 68 is attached which has a shape of a disc and is made of aluminum or the like for example. When the diaphragm 66 is deformed, the valve body 68 is seated on the valve seat 62 made of Teflon (a registered trademark) or the like for example, thereby closing the opening at the upper end of the gas passage 56. The aforementioned open/close valve 60 is constituted in this way of the valve seat 62 and the valve body 68. Note that the diaphragm 66 may be provided by a bellows.

On the center part of the upper surface of the valve body 68, an upwardly extending valve rod 70 is securely fixed, and around the periphery of this valve rod 70 a coiled spring 72 is wound as a spring member to apply a downward force to the valve body 68 i.e. in the direction for the valve to be closed. This coiled spring 72 is housed in a spring housing 74 which is shaped in an upward convex of the center part of the ceiling board 64. The valve rod 70 is slidable and protruded out through the ceiling part of this spring housing 74, and the end of this valve rod 70 is joined to an actuator 76 which operates by compressed air supply for example. Consequently, the aforementioned open/close valve 60 can be opened and closed by supplying/evacuating compressed air to/from the actuator 76. The periphery of the coiled spring 72 is surrounded by an elastic bellows 78 so that the particles from the coiled spring 72 are confined inside and prevented from dispersing.

The material reservoir tank 58 is provided with a first carrier gas supply means 80 for feeding a carrier gas composed of inert gas therein. To be more precise, this first carrier gas supply means 80 mainly comprises a gas injection plate 82 which is provided in the bottom portion of the material reservoir tank 58 and positioned slightly higher than the bottom surface, and a gas diffusion chamber 84 defined below this gas injection plate 82.

The gas injection plate 82 is made of aluminum, AlN or the like with a thickness of 4-12 mm for example and is shaped in a disc as shown in FIG. 2. A number of gas injection holes 86 are formed in the whole surface of the gas injection plate 82, each of which has a diameter of 0.5 mm for example, and as shown in FIG. 3, a carrier gas from the gas diffusion chamber 84 below is injected from each gas injection hole 86 so that the metallic compound material M located above can be evaporated to provide a material gas.

In the sidewall of the material reservoir tank 58 defining the gas diffusion chamber 84, a gas feed opening 88 is formed. This gas feed opening 88 is connected to a carrier gas line 92 with a flow controller 90, such as a mass flow controller, intermediately inserted therebetween so that a carrier gas, e.g. Ar gas, can be supplied into the gas diffusion chamber 84.

To the whole upper surface of the gas injection plate 82, a porous fluorinated resin film 94 with a thickness of approximately 0.1 mm for example is applied. This porous fluorinated resin film 94 is made of porous Teflon (a registered trademark) or Poreflon (a registered trademark: Sumitomo Electric Fine Polymer Inc.) for example, through which gas molecules such as Ar gas can be passed upwardly while liquid such as liquid material cannot. Note that fluorinated resin films may be coated on the whole inner surface of the sidewall and inner structure of the material reservoir tank 58 and also on the diaphragm 66. In this case, one-side wear of the metallic compound material can be controlled particularly when the metallic compound material M is solid, because the inner surface of the sidewall with which the material is always in contact becomes slick.

Inside the gas injection plate 82, a linear or planar resistance heater 96, for example, as a material heating means is implanted across substantially the whole surface so that the retained metallic compound material M can be heated as necessary to promote evaporation.

To detect the temperature of this resistance heater 96, a thermocouple 98, for example, is positioned in close proximity as a temperature detecting means. Based on the value detected by this thermocouple 98, a controller 100 in the form of a microcomputer or the like for example can control a power section 102 which supplies electric power to the resistance heater 96, as shown in FIG. 1.

Additionally, in the upper part of the sidewall of the material reservoir tank 58, a pre-flow outlet 104 is provided for use in eliminating excess gas and stabilizing gas flow, and is connected to the side of the exhaust line 34 linked by a pre-flow line in which an open/close valve is inserted, not shown. Note that a tape heater, for example, may be wound around the periphery of the gas passage 56 for heating in order to prevent the material gas to be re-liquefied.

In the next place, the operation of the processing system with the above-mentioned structure will be explained. Firstly, an unprocessed semiconductor wafer W is loaded into the processing vessel 26 by way of the open gate valve 40 and mounted on the susceptor 38, and the inside of the processing vessel 26 is sealed. Then, while the temperature of the wafer W is raised to a specific processing temperature by the incorporated heater of the susceptor 38 and maintained, a material gas of metallic compound material supplied from the gas supply system 24 is fed from the showerhead portion 42 into the processing space S, and at the same time, other necessary gas, e.g. an oxidation gas etc., is fed from the gas holes 48 of the showerhead portion 42 into the processing space S. Note that the structure inside the showerhead portion 42 is determined as necessary wherein a material gas and other gas may be mixed inside the showerhead portion 42, or a material gas may be mixed with other gas when injected into the processing space S (post mix). In addition, a single material gas of metallic compound material may be fed to be processed (thermal reaction).

In this manner, the metallic compound material is decomposed and thin films, such as a metallic thin film, oxide film of metallic material, nitride film, silicone compound film, etc. are deposited on the surface of the wafer W.

The operation of the gas supply system 24 is hereinafter explained in detail.

In supplying a material gas to the side of the processing apparatus 22, firstly a carrier gas (Ar) at a controlled flow rate is fed from the carrier gas line 92 of the gas supply system 24 to the gas diffusion chamber 84 of the first carrier gas supply means 80. The carrier gas, diffusing in the planar direction inside the gas diffusion chamber 84, is injected upwardly from each of the gas injection holes 86 of the gas injection plate 82 provided above the gas diffusion chamber 84 (refer to FIGS. 2 and 3), thereby evaporating the liquid or solid metallic compound material M retained inside the material reservoir tank 58, thus producing a material gas. At this point, the evaporation of the material gas is promoted by operating the resistance heater 96 implanted in this gas injection plate 82 for heating. In this case, since the heat capacity of this resistance heater 96 and the gas injection plate 82 in which the resistance heater 96 is implanted is set quite low, the heat response is excellent and the power section 102 can be controlled to promptly compensate for lost heat of vaporization.

Accompanied by the carrier gas, the material gas produced inside the material reservoir tank 58 flows from the upper-end opening of the gas passage 56 by way of the opened open/close valve 60 into the gas passage 56 with a relatively large diameter, as shown in FIG. 1. Note that the open/close operation of the open/close valve 60 is performed by feeding compressed air into the actuator 76 or evacuating compressed air by the actuator 76, thereby moving the valve rod 70 and the valve body 68 attached to the lower end thereof in the vertical direction.

The material gas flown into the gas passage 56 spontaneously flows downwardly inside the gas passage 56 into the diffusion chamber 44 inside the showerhead portion 42 where this material gas is then diffused and fed into the processing space S from the gas holes 48 as previously described.

At this occasion, the temperature of the resistance heater 96 implanted in the gas injection plate 82 is constantly detected by the thermocouple 98 and the detected values are entered in the controller 100, and this controller 100 controls the power section 102 so that the resistance heater 96 maintains a specific temperature.

At this point, since the gas passage 56 through which the material gas flows has a quite large internal diameter and is straight to the showerhead portion 42 with a quite short distance therebetween e.g. approximately 30 cm, the exhaust conductance is so enhanced that pressure loss generation can be considerably decreased. Consequently, the pressure differential between inside the showerhead portion 42 or the processing space S and inside the material reservoir tank 58 is considerably decreased, thus the material gas can be effectively produced by just that much. Although it depends on the kind of the metallic compound material M used or the processing conditions applied for example, in a case that the organic metal material M with equal to or less than 1 Torr (133 Pa) is used and the pressure in the processing space S is approximately 10 to 150 mTorr, the pressure inside the material reservoir tank 58 is approximately 30 to 200 mTorr. In addition, the carrier gas is to be supplied from each of the gas injection holes 86 of the gas injection plate 82 of the first carrier gas supply means 80 provided in the bottom portion of the material reservoir tank 58 to be injected over the whole surface of the bottom portion, and thereby the whole bottom surface of the material can be evaporated evenly without one-side wear of the material particularly when the metallic compound material M is solid, and thus the flow amount of the produced material gas can be stabilized.

Moreover, particularly because the resistance heater 96 provided across the whole surface of the bottom portion of the material reservoir tank 58 is controlled to maintain a predetermined specific temperature, the amount of the material gas production can be controlled with high accuracy. Needless to add that the correlation between the amount of the material gas and the temperature is evaluated in advance, and the temperature is controlled corresponding to the material gas flow amount that is needed.

Furthermore, on the upper surface of the gas injection plate 82, the fluorinated resin film 94 is applied which is porous to pass the carrier gas, a gas, without passing liquid or solid material and offers outstanding resistance to heat and corrosion, thus preventing the material gas and the liquid metallic compound material M from entering the side of the gas diffusion chamber 84 below by regurgitation. In addition, by flowing a purge gas such as Ar gas from the purge gas feed pipe 57 while film formation is not performed, the purge gas can flow at a fast flow rate, thereby easily removing reaction by-products adhered to the showerhead portion 42 and the interior of the processing vessel 26.

Figure 4:
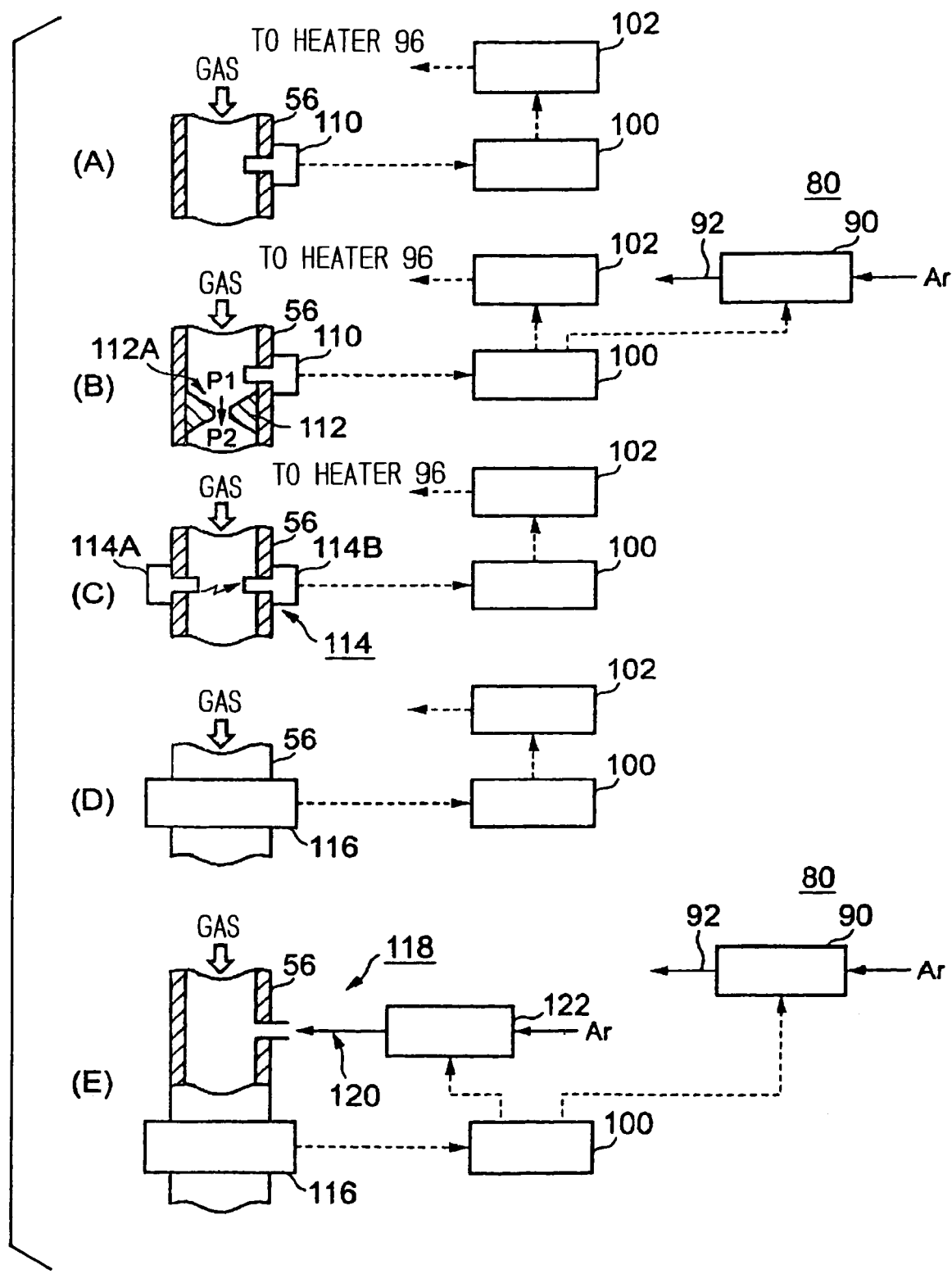
FIG. 4 is a block diagram showing the modifications of an embodiment of control.

In the above embodiment, the controller 100 controls the temperature of the resistance heater 96 to maintain a constant temperature value. Alternatively, the control may be performed as explained below. FIG. 4 is a block diagram showing the modifications of the embodiment of control, wherein only the parts necessary for the control are extracted from the components shown in FIG. 1 and illustrated in pattern diagrams.

<First Modification>

In the case shown in FIG. 4(A), a pressure detecting means 110 is provided in the gas passage 56 for detecting the pressure therein, and the controller 100 controls the power section 102 so that the value detected by this pressure detecting means 110 is maintained at a specific value. This pressure detecting means 110 can be a capacitance manometer or a pressure transducer. Additionally, the pressure detecting means 110 may be provided not only in the gas passage 56 but also in the material reservoir tank 58 so as to detect the pressure inside the material reservoir tank 58.

As a result, when the pressure inside the gas passage 56 for example is increased or decreased for some reason, the heat release amount of the resistance heater 96 is controlled to settle the pressure to maintain a predetermined specific value. The amount of the material gas production can thus be controlled with high accuracy. Needless to say that, in this case, the supplying flow amount of the carrier gas (Ar) is maintained at a specific amount.

<Second Modification>

In the case shown in FIG. 4(B), an orifice means 112 having a narrow opening 112A is provided inside the gas passage 56, and the pressure detecting means 110 is provided, as in the first modification, on the upstream side of this orifice means 112. This pressure detecting means 110 may be provided at the material reservoir tank 58.

In this case, the figure of the entrance side of the orifice means 112 is continuously narrowed down so as to provide a sonic nozzle (critical flow nozzle) condition. More specifically, given that the pressure ratio of the upstream to downstream is equal to or more than approximately 0.5 and that the pressure on the upstream side is P1, the pressure on the downstream side P2 and P1>2×P2 for example, the flow rate at the opening 112A as a throat portion reaches sonic velocity and the flow amount is in direct proportion to the pressure on the upstream side regardless of the pressure on the downstream side, offering easy control. In this case, when the internal diameter of the gas passage 56 is approximately 40 mm for example, the internal diameter of the opening 112A of the orifice means 112 is approximately 7 mm.

The controller 100 controls the heat release amount of the resistance heater 96 by way of the power section 102 to maintain the sonic nozzle condition in this way, or controls the supplying flow amount of the carrier gas by controlling the flow controller 90. Note that the controller 100 may be provided to control the both of the above. The amount of the material gas production can thus be controlled with high accuracy.

<Third Modification>

In the case shown in FIG. 4(C), a partial pressure detecting means 114 is provided in the gas passage 56 for detecting the partial pressure of the material gas in the gas flowing therein. This partial pressure detecting means 114 may be provided at the material reservoir tank 58. This partial pressure detecting means 114 comprises an infrared emitter 114A and a receiver 114B and measures the gas concentration of specific molecules with its spectrum. This partial pressure detecting means 114 can be an FTIR Analyzer (a registered trademark: Horiba Ltd.) for example.

The controller 100 results in decreasing the heat release amount of the resistance heater 96 so that the detected value (partial pressure value) of the material gas detected by the partial pressure detecting means 114 is maintained at a predetermined specific value. The amount of the material gas production can thus be controlled with high accuracy. Needless to say that, in this case, the supplying flow amount of the carrier gas (Ar) is maintained at a specific amount. In addition, the orifice means 112 is not provided in this case, and thus pressure loss generation can be decreased by just that much.

<Forth Modification>

In the case shown in FIG. 4(D), a gas flow detecting means 116, in the form of a gas flow meter for example, is provided at the gas passage 56 for detecting the total amount of gas flowing therethrough.

The controller 100 results in decreasing the heat release amount of the resistance heater 96 so that the value (total gas flow amount) detected by this gas flow detecting means 116 is maintained at a predetermined specific value. The amount of the material gas production can thus be controlled with high accuracy. Needless to say that, in this case, the supplying flow amount of the carrier gas (Ar) is maintained at a specific amount.

<Fifth Modification>

In the case shown in FIG. 4(E), a second carrier gas supply means 118 is connected to the gas passage 56 for feeding a carrier gas therein. This second carrier gas supply means 118 comprises a carrier gas line 120 and a flow controller 122 such as a mass flow controller inserted in this carrier gas line 120, and employs Ar gas as a carrier gas, as used in the aforementioned first carrier gas supply means 80 (refer to FIG. 1), which can be fed into the gas passage 56 at a controlled flow rate controlled by the controller 100.

As in the forth modification the gas flow detecting means 116 is provided at the gas passage 56 on the downstream side of the connection point of the second carrier gas supply means 118 and the gas passage 56 for detecting the total amount of gas flowing through the gas passage 56.

The controller 100 thus controls each of the flow controller 90, 122 of the aforementioned first and second carrier gas supply means 80, 118 so that the material gas flow in gas flow is maintained at a specific amount.

That is, it is known that the flow amount of the material gas produced inside the material reservoir tank 58 generally is in substantial proportion to the flow amount of the carrier gas supplied thereto. When the amount of the material gas production is decreased for some reason, whereas the first and second carrier gas supply means 80, 118 flow specific amount of the carrier gas respectively and a specific material gas is stably produced, the amount decreased is detected by a gas flow detecting means as a changed flow amount. The controller 100 then increases the flow amount of the carrier gas at the first carrier gas supply means 80 to promote evaporation of the material gas in order to compensate for the decreased flow amount, while decreasing the flow amount of the carrier gas at the second carrier gas supply means 118 by just the amount increased.

Consequently, the total gas flow amount and the material gas flow amount flowing in the gas flow detecting means 116 of the gas passage 56 can be maintained respectively at specific values with high accuracy.

In more specific terms of this control method using certain numeral examples, assuming that 100 standard cc/min (sccm) of a carrier gas is flown from the first and second carrier gas supply means 80, 118 respectively at present and a material gas is produced at the flow rate of 10 sccm at this point, the gas flow amount totals 210 sccm.

Given that the amount of the material gas production is decreased by 1 sccm to reach 9 sccm for some reason, which means the material gas production is decreased by 10%, the supplying flow amount of the carrier gas at the first carrier gas supply means 80 is then increased by 10 sccm (10%), from 100 sccm to reach 110 sccm, in order to compensate for the decrease. Note that the correlation between the flow amount of the carrier gas and that of the produced material gas is evaluated in advance.

As a result, the amount of the material gas production is brought back to in-situ 10 sccm from 9 sccm due to the carrier gas increase. Since the change of the total gas-supply amount into the processing space S is not preferable on the other hand, the supplying flow amount of the carrier gas at the second carrier gas supply means 118 is at the same time decreased by 10 sccm that is equivalent of the amount increased in the carrier gas at the first carrier gas supply means 80. In other words, the gas-supply amount at the second carrier gas supply means 118 is decreased from 100 sccm to 90 sccm.

In this manner the total gas flow amount is maintained at 210 sccm constantly. In case of increase in the flow amount of the material gas, the reverse of the above flow-rate operation may be conducted.

Figure 5:
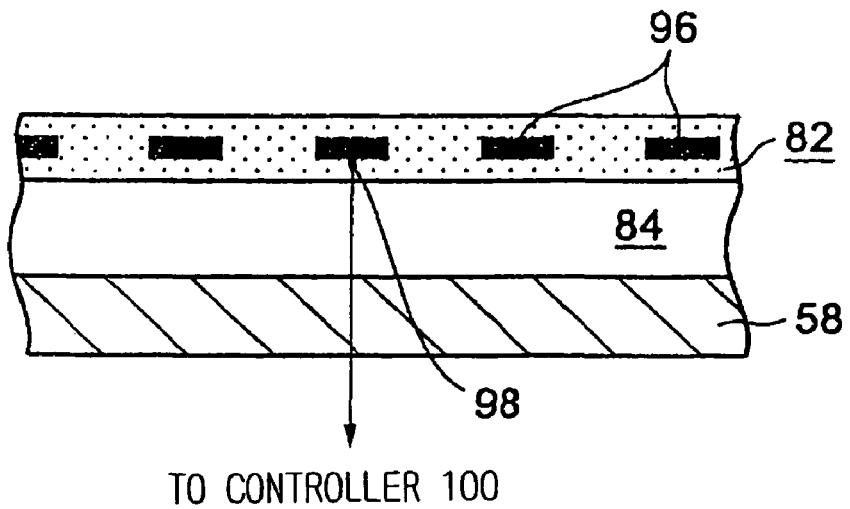
FIG. 5 is an enlarged cross-sectional view showing a gas injection plate with a resistance heater which is implanted into a porous fluorinated resin.

Although, in the above embodiments, the gas injection plate 82 is shaped and made of aluminum, AlN or the like with the gas injection holes 86 provided thereto by perforation or the like, the resistance heater 96 implanted therein and the porous fluorinated resin film 94 provided thereon as shown in FIG. 3, the present invention is not limited to the above. As shown in FIG. 5, the porous fluorinated resin film itself may be formed into the gas injection plate 82 by increasing the thickness, with the resistance heater 96 implanted therein. In this case, the porous property of fluorinated resin material itself functions as fine injection holes, and therefore there is no need of further perforation for the gas injection holes.

Figure 6:
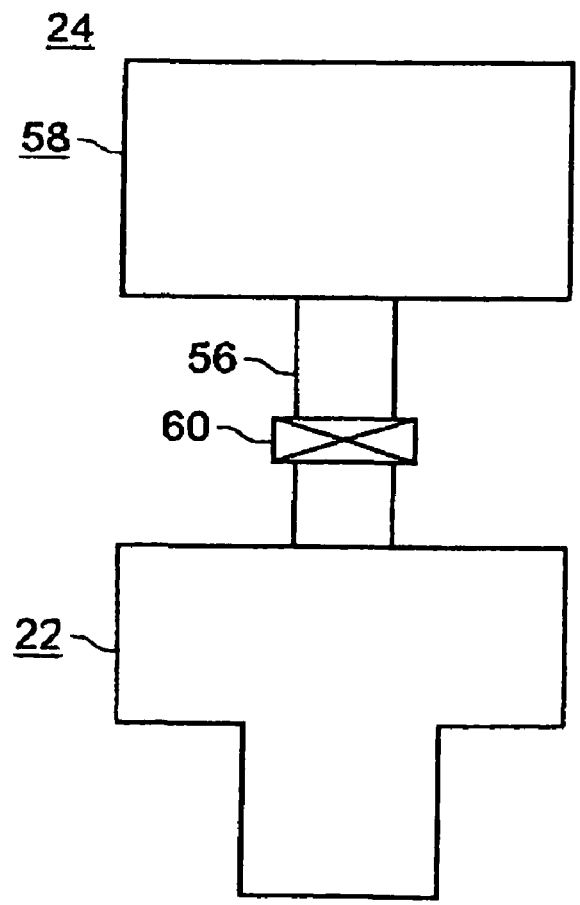
FIG. 6 is a diagram showing a modification of the first invention.

Moreover, although the open/close valve 60 is provided inside the material reservoir tank 58 in the structure shown in FIG. 1, the structure is not limited to the above. As shown in FIG. 6, the open/close valve 60 having a regular structure may be provided in the intermediate part of the gas passage 56.

Figure 7:
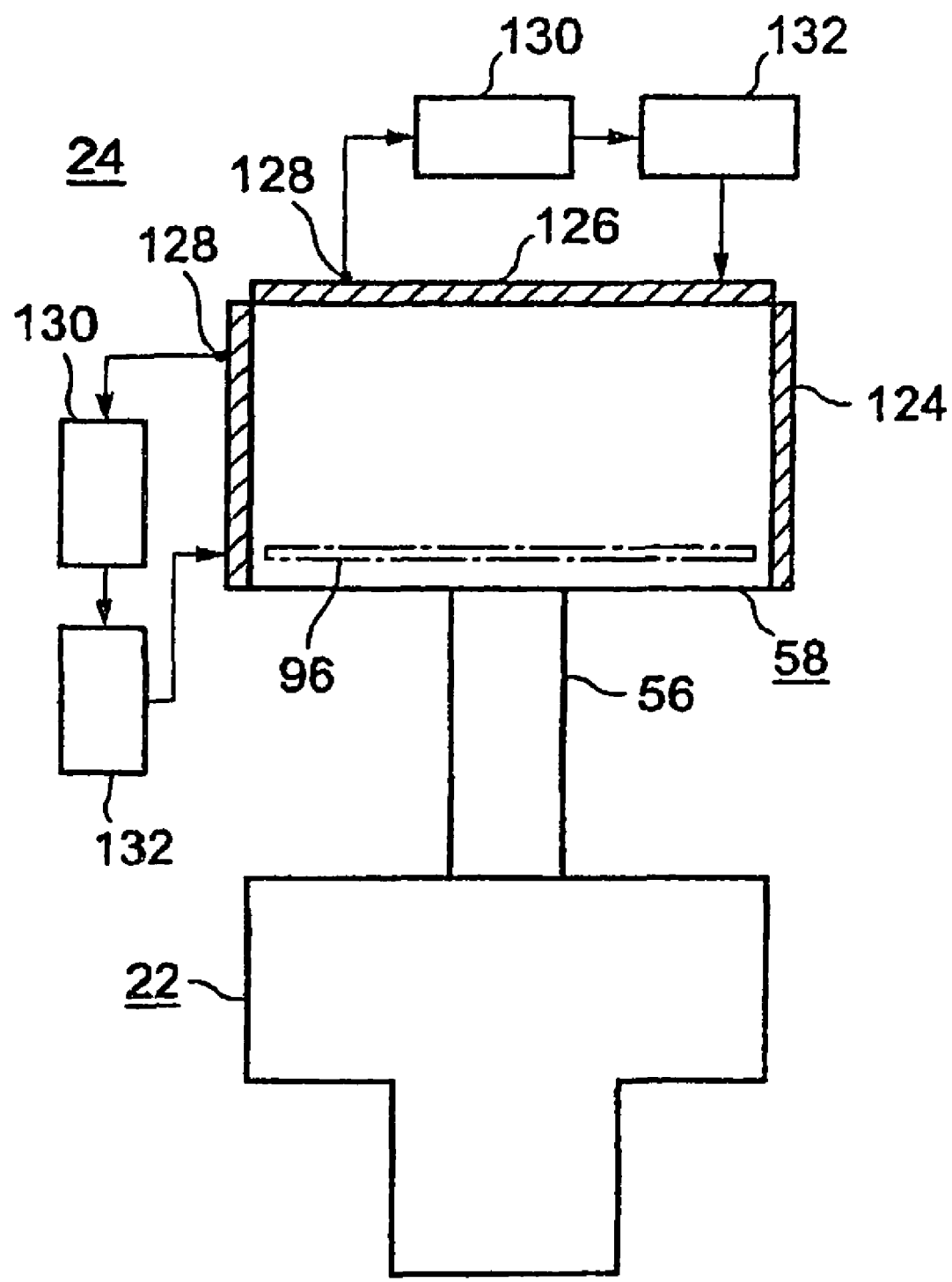
FIG. 7 is a diagram showing another modification of the first invention.

Furthermore, although the resistance heater 96 is provided solely in the bottom portion of the material reservoir tank 58 in the structure shown in FIG. 1, the structure is not limited to the above. As shown in FIG. 7, resistance heaters (material heating means) 124 and/or 126 may be provided at the side portion and/or the ceiling portion of the material reservoir tank 58 in addition to the resistance heater 96 in the bottom portion to prevent the material gas that is being evaporated from re-liquefaction. In this case, a thermocouple 128 may be provided at each of the resistance heaters 124, 126 so that the structure allows controllers 130 and power sections 132 to further provide individual temperature control.

<Second Invention>

Although, in the embodiments above, the exhaust conductance is enhanced as much as possible by substantially directly interconnecting the material reservoir tank 58 to the upper area of the processing apparatus 22, the present invention is not limited to the above but also can be applied to a gas supply system with a narrow and long gas passage as in a conventional apparatus.

Figure 8:
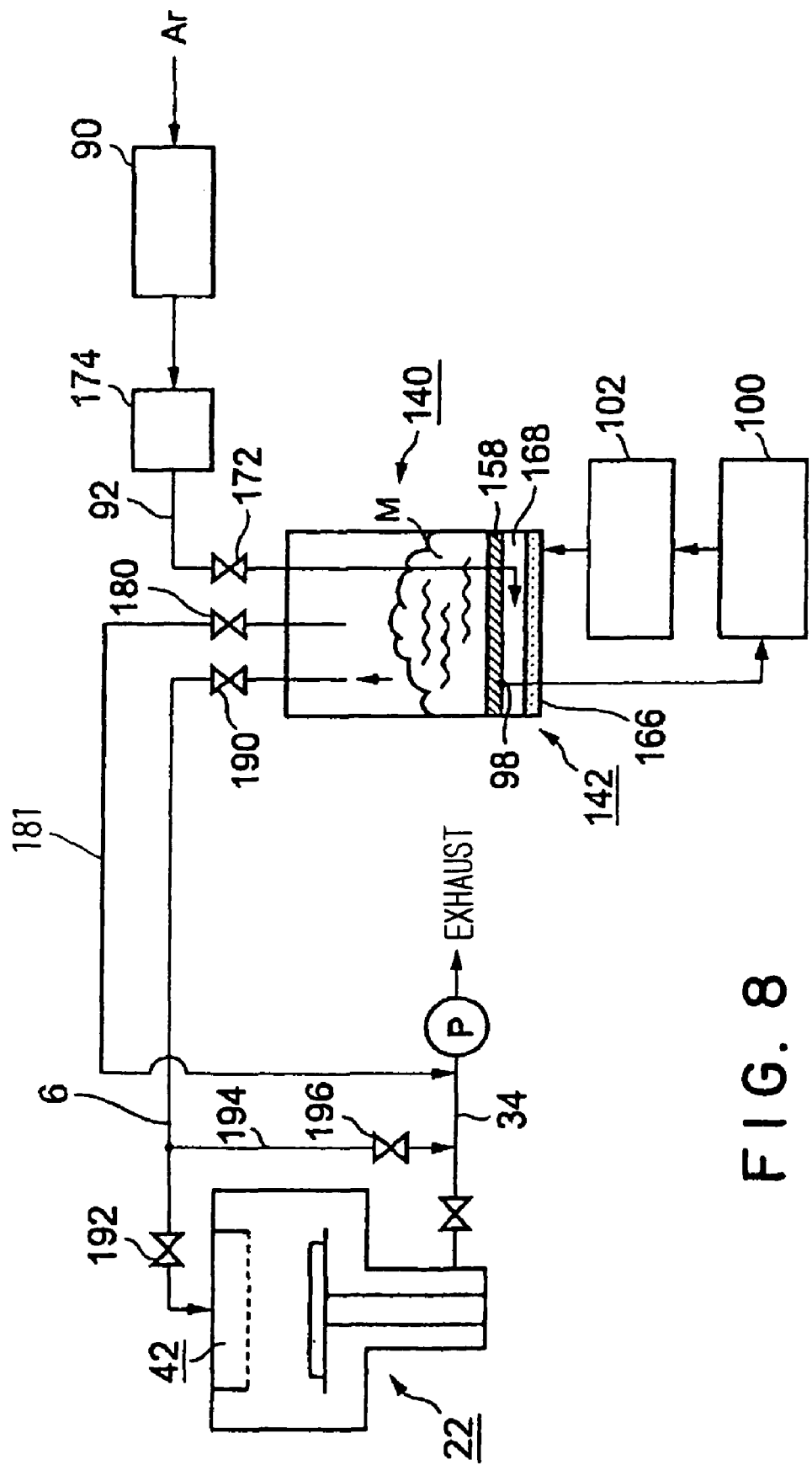
FIG. 8 is a structural block diagram showing a second invention of the processing system according to the present invention.
Figure 9:
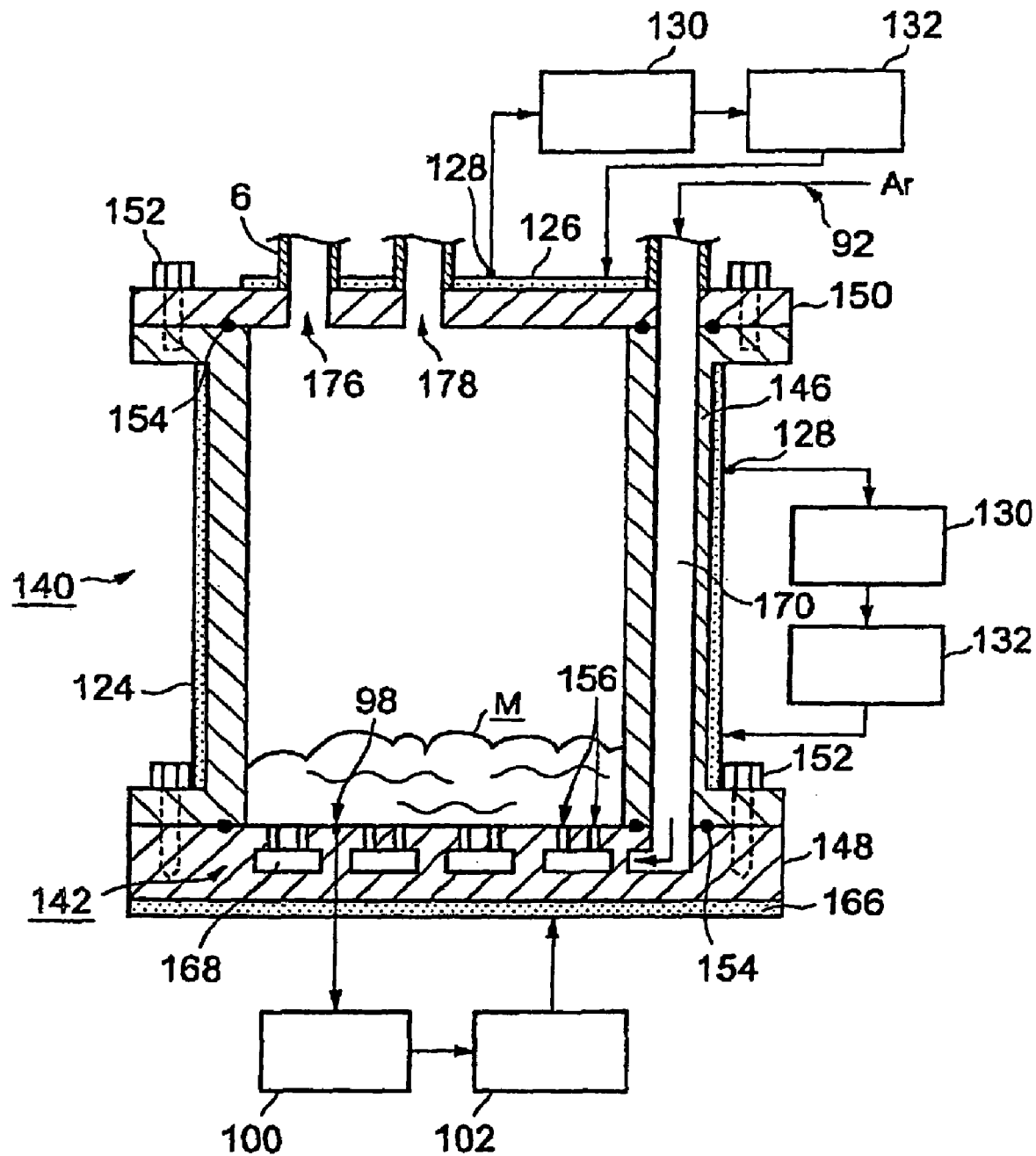
FIG. 9 is an enlarged cross-sectional view showing a material reservoir tank.
Figure 10:
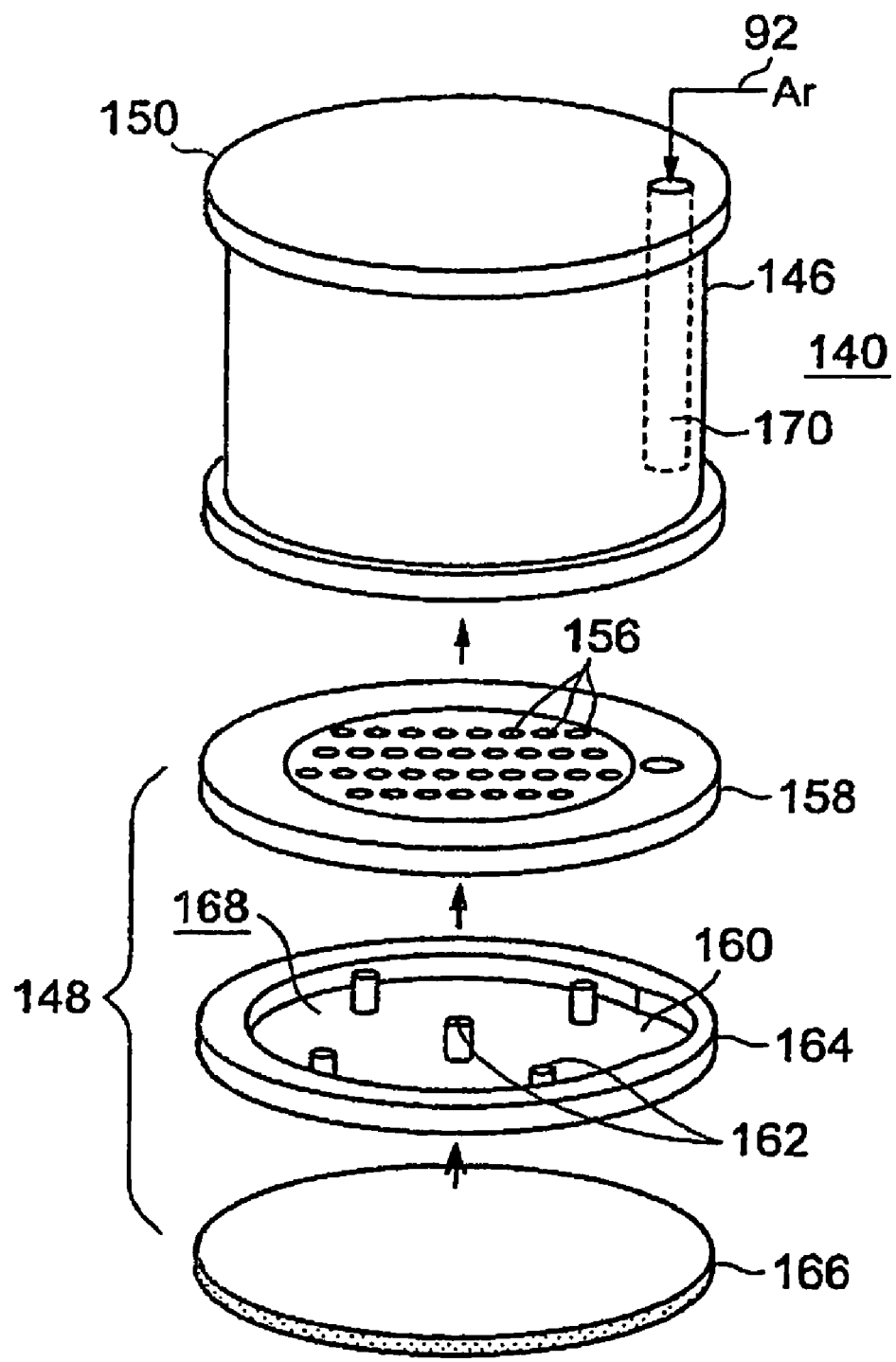
FIG. 10 is an exploded perspective view showing the material reservoir tank.

FIG. 8 is a structural block diagram showing a second invention of the processing system according to the present invention, FIG. 9 is an enlarged cross-sectional view showing a material reservoir tank, and FIG. 10 is an exploded perspective view showing the material reservoir tank. In FIG. 8, the same reference characters are applied to the same structural components as the previously explained with their explanations omitted.

Figure 21:
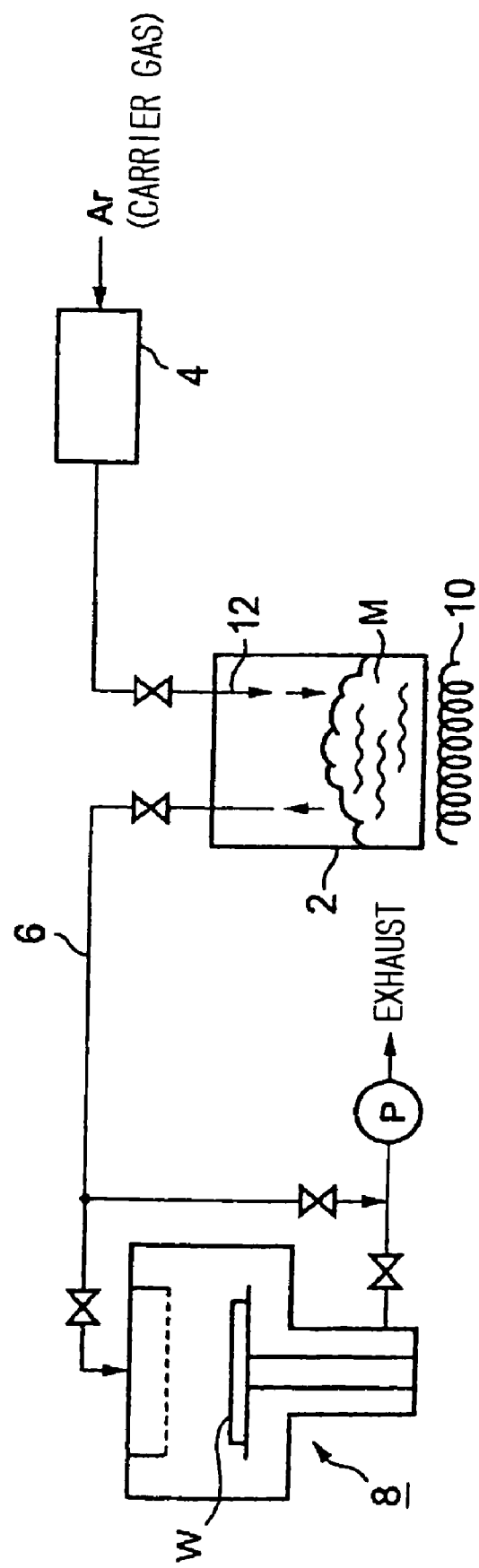
FIG. 21 is a structural block diagram showing a conventional gas supply system of a material gas composed of metallic compound material.

In the processing system shown in FIG. 8, a gas passage 6 of the same sort as explained in FIG. 21 is extended from the showerhead portion 42 of the processing apparatus 22, as a part of the gas supply system. The internal diameter of this gas passage 6 is approximately 12.7 mm for example and the length approximately 1 m for example, depending on the installation location of a material reservoir tank 140.

As shown in FIGS. 9 and 10, a first carrier gas supply means 142 and a material heating means 166 are provided on the side of the bottom portion of the material reservoir tank 140 which is connected to the end of the long gas passage 6. A side portion 146 and bottom portion 148 of the material reservoir tank 140 are comprised of aluminum for example in consideration of heat conductance, and a ceiling portion 150 is formed of stainless steel for example in consideration of welding to the other components. Each of the ceiling portion 150 and the bottom portion 148 is securely joined to the side of the side portion 146 with a bolt 152 via a sealing member 154 such as an O-ring.

The bottom portion 148 is combined with the first carrier gas supply means 142 and provides a shower structure. To be more precise, a plate-shaped shower portion 158 in which a number of gas injection holes 156 are formed in a planar configuration, a plate-shaped frame body 164 provided with a recess 160 formed in the inner side on which struts 162 are uprisen, and the resistance heater (material heating means) 166 with a shape of a disc are laminated in the bottom portion 148 to provide an integral structure.

In this case, a gas diffusion chamber 168 is formed in the recess 160 by the shower portion 158 joined onto the recess 160. This gas diffusion chamber 168 is linked to a gas feed passage 170 which is formed piercing through the shower portion 158 and the side portion 146 and ceiling portion 150 of the material reservoir tank 140. The upper end of this gas feed passage 170 is connected to the carrier gas line 92 in which an open/close valve 172, a filter means 174 and the flow controller 90 are inserted sequentially, as shown in FIG. 8, and thereby Ar gas as a carrier gas is supplied.

In addition, the whole upper surface of the shower portion 158 is coated (including by application/attachment) with aforementioned porous fluorinated resin (not shown), e.g. porous Teflon (a registered trademark), through which Ar gas can be passed downwardly while solid or liquid metallic compound material M cannot. This coating has the function of heat insulation and thus is employed also on the joining surface to the side portion 146, thereby decreasing the heat transfer from the bottom portion 148 to the side portion 146, and the heat control of the bottom portion 148 becomes easy as a result.

Moreover, the thermocouple 98 as a temperature detecting means is provided in the proximity of the upper surface of this bottom portion 148, and the detected value is entered in the controller 100 to control the power section 102 so that the heat release amount can be controlled.

Preferably, the inner surface of the side portion 146 of the material reservoir tank 140 is also coated with Teflon (a registered trademark). As a result the metallic compound material M comes down without adhering to the side surface, given that the metallic compound material M is solid, and therefore preventing one-side wear of the material to be caused by which the flow amount of the material gas can be unstable.

In addition, as well as a second gas outlet 178 used to evacuate unnecessary gas, a first gas outlet 176 interconnected to the gas passage 6 is provided in the ceiling portion 150. This second gas outlet 178 is connected to the exhaust line 34 of the processing apparatus 22 by way of a gas line 181 in which an open/close valve 180 is inserted, as shown in FIG. 8.

Moreover, as in the same manner as shown in FIG. 7, the resistance heater (material heating means) 124, 126, each of which are provided with the thermocouple 128, are also provided outside the side portion 146 and the ceiling portion 150 of the material reservoir tank 140, and thus the heat release amount of each of the heaters 124, 126 is controlled by controlling the power sections 132 with the controller 130. In this case, the preset temperature value of each of the resistance heaters 124, 126 is set lower than that of the resistance heater 166 of the bottom portion 148, lower enough for the material gas not to be re-liquefied or re-solidified, so that evaporation of the metallic compound material M is controlled and mainly generated solely at the shower portion 158 of the bottom portion 148.

Furthermore, as shown in FIG. 8, open/close valves 190, 192 are inserted in the gas passage 6, on the upstream side and the downstream side respectively, and an evac line 194 in which an open/close valve 196 is inserted as well is connected to and branched off from between the open/close valves 190 and 192 toward the exhaust line 34 so that unnecessary material gas can be disposed of. Note that the whole gas passage 6 is heated by a tape heater or the like wound therearound to prevent the material gas from re-liquefaction.

In the case of the embodiment structured as above, again, the carrier gas fed into the gas diffusion chamber 168 of the first carrier gas supply means 142 is diffused toward the whole surface of the bottom portion and then fed upwardly from each of the gas injection holes 156 into the material reservoir tank 140 to allow the metallic compound material M evaporated. In this case, the carrier gas is injected from substantially the whole surface of the bottom portion, thereby preventing one-side wear of the metallic compound material M from being caused, and thus the amount of the material gas production, i.e. the gas flow amount, can be stabilized.

At this point, the flow amount of the material gas can be controlled with high accuracy because the temperature in the proximity of the shower portion 158 of the bottom portion 148 is detected by the thermocouple 98 and the controller 100 controls the heat release amount by controlling the power section 102 for this temperature to be maintained at a specific value.

In addition, the flow amount of the material gas can be further stabilized because the resistance heater 166 of the bottom portion 148 is provided over substantially the whole surface so that the metallic compound material M can also be evaporated by the heat from the whole surface of the bottom portion.

Figure 11:
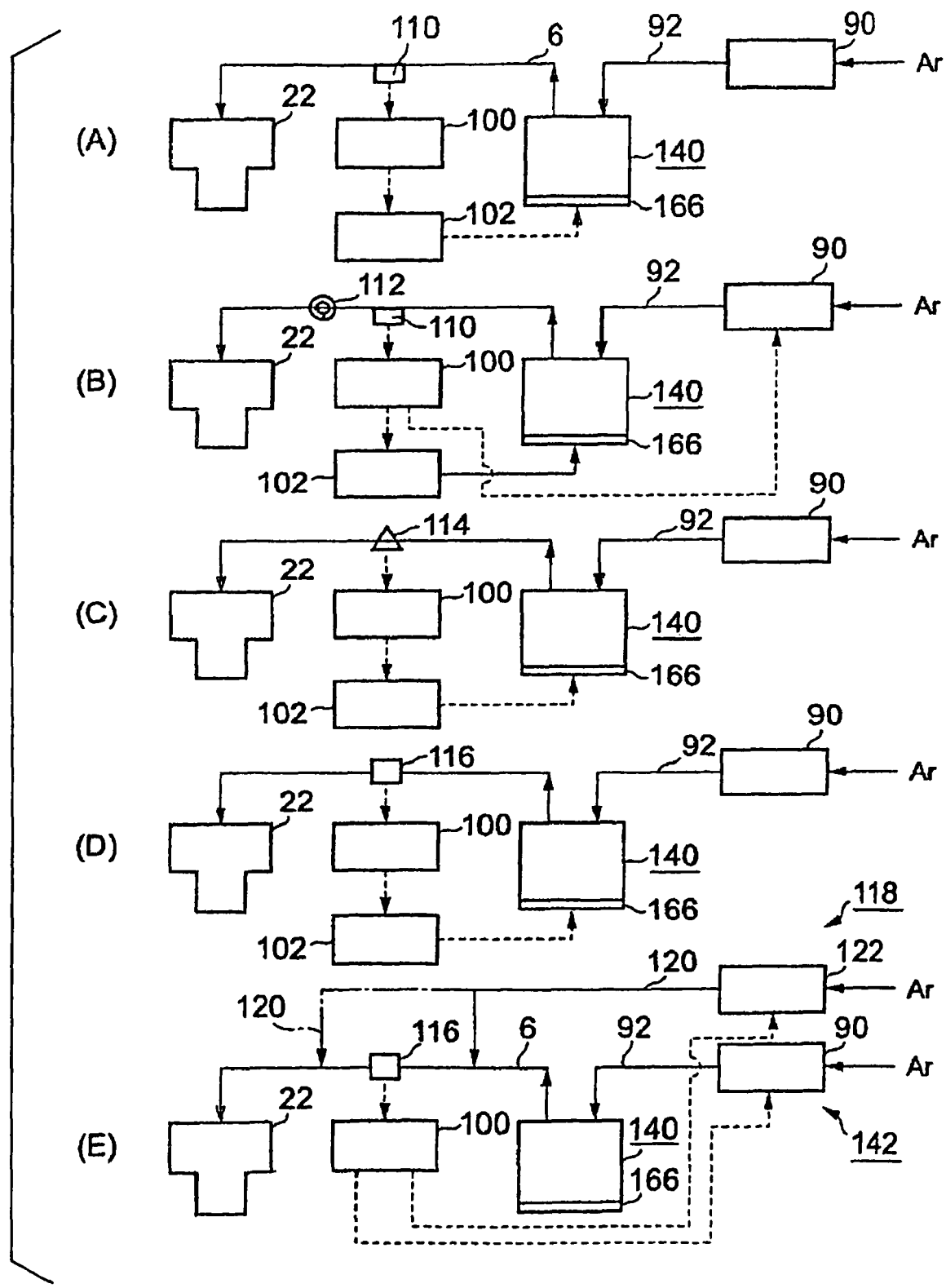
FIG. 11 is a block diagram showing the modifications of an embodiment of control.

The modifications of the above embodiment will be explained in the next place. FIG. 11 is a block diagram showing the modifications of the embodiment of control, wherein only the parts necessary for the control are extracted from the components shown in FIG. 8 and illustrated in pattern diagrams. Additionally, the sixth modification to tenth modification hereinafter explained are respectively corresponding to the first modification to the fifth modification shown in FIG. 4.

<Sixth Modification>

In the case shown in FIG. 11(A), a pressure detecting means 110 is provided in the gas passage 6 for detecting the pressure therein, and the controller 100 controls the power section 102 so that the value detected by this pressure detecting means 110 is maintained at a specific value. This pressure detecting means 110 can be a capacitance manometer or a pressure transducer.

As a result, when the pressure inside the gas passage 6 for example is increased or decreased for some reason, the heat release amount of the resistance heater 166 is controlled to settle the pressure to maintain a predetermined specific value. The amount of the material gas production can thus be controlled with high accuracy. Needless to say that, in this case, the supplying flow amount of the carrier gas (Ar) is maintained at a specific amount.

<Seventh Modification>

In the case shown in FIG. 11(B), an orifice means 112 having a narrow opening 112A is provided inside the gas passage 6, and a pressure detecting means 110 is provided, as in the sixth modification, on the upstream side of this orifice means 112.

At this point, the figure of the entrance side of the orifice means 112 is continuously narrowed down so as to provide a sonic nozzle (critical flow nozzle) condition, as explained in FIG. 4(B). More specifically, given that the pressure ratio of the upstream to downstream is equal to or more than approximately 0.5, the flow rate at the opening as a throat portion reaches sonic velocity and the flow amount is in proportion to the pressure on the upstream side regardless of the pressure on the downstream side. In this case, when the internal diameter of the gas passage 6 is approximately 12.7 mm for example, the internal diameter of the opening (not shown) of the orifice means 112 is approximately 2.2 mm.

The controller 100 controls the heat release amount of the resistance heater 166 by way of the power section 102 to maintain the sonic nozzle condition in this way, or controls the supplying flow amount of the carrier gas by controlling the flow controller 90. Note that the controller 100 may be provided to control the both of the above. The amount of the material gas production can thus be controlled with high accuracy.

<Eighth Modification>

In the case shown in FIG. 11(C), a partial pressure detecting means 114 is provided in the gas passage 6 for detecting the partial pressure of the material gas in the gas flowing therein. This partial pressure detecting means 114 may be provided at the material reservoir tank 140.

This partial pressure detecting means 114 comprises an infrared emitter and a receiver, as previously described, and measures the gas concentration of specific molecules with its spectrum.

The controller 100 decreases the heat release amount of the resistance heater 166 so that the detected value (partial pressure value) of the material gas detected by the partial pressure detecting means 114 is maintained at a predetermined specific value. The amount of the material gas production can thus be controlled with high accuracy. Needless to say that, in this case, the supplying flow amount of the carrier gas (Ar) is maintained at a specific amount. In addition, the orifice means 112 is not provided in this case, and thus pressure loss generation can be decreased by just that much.

<Ninth Modification>

In the case shown in FIG. 11(D), a gas flow detecting means 116, in the form of a gas flow meter for example, is provided at the gas passage 6 for detecting the total amount of gas flowing therethrough.

The controller 100 decreases the heat release amount of the resistance heater 166 so that the value (total gas flow amount) detected by this gas flow detecting means 116 is maintained at a predetermined specific value. The amount of the material gas production can thus be controlled with high accuracy. Needless to say that, in this case, the supplying flow amount of the carrier gas (Ar) is maintained at a specific amount.

<Tenth Modification>

In the case shown in FIG. 11(E), a second carrier gas supply means 118 is connected to the gas passage 6 for feeding a carrier gas therein. This second carrier gas supply means 118 comprises a carrier gas line 120 and a flow controller 122 such as a mass flow controller inserted in this carrier gas line 120, and employs Ar gas as a carrier gas, as used in the aforementioned first carrier gas supply means 142 (refer to FIG. 8), which can be fed into the gas passage 6 at a controlled flow rate controlled by the controller 100.

As in the ninth modification the gas flow detecting means 116 is provided at the gas passage 6 on the downstream side of the connection point of the second carrier gas supply means 118 and the gas passage 6 for detecting the total amount of gas flowing through the gas passage 6.

The controller 100 thus controls each of the flow controller 90, 122 of the aforementioned first and second carrier gas supply means 142, 118 so that the material gas flow in gas flow is maintained at a specific amount.

That is, it is known that the flow amount of the material gas produced inside the material reservoir tank 140 generally is in substantial proportion to the flow amount of the carrier gas supplied thereto. When the amount of the material gas production is decreased for some reason, whereas the first and second carrier gas supply means 142, 118 flow specific amount of the carrier gas respectively and a specific material gas is stably produced, the amount decreased is detected by a gas flow detecting means as a changed flow amount. The controller 100 then increases the flow amount of the carrier gas at the first carrier gas supply means 142 to promote evaporation of the material gas in order to compensate for the decreased flow amount, while decreasing the flow amount of the carrier gas at the second carrier gas supply means 118 by just the amount increased.

Consequently, the total gas flow amount and the material gas flow amount flowing in the gas flow detecting means 116 of the gas passage 6 can be maintained respectively at specific values with high accuracy.

In more specific terms of this control method using certain numeral examples, assuming that 100 standard cc/min (sccm) of a carrier gas is flown from the first and second carrier gas supply means 142, 118 respectively at present and a material gas is produced at the flow rate of 10 sccm at this point, the gas flow amount totals 210 sccm.

Given that the amount of the material gas production is decreased by 1 sccm to reach 9 sccm for some reason, which means the material gas production is decreased by 10%, the supplying flow amount of the carrier gas at the first carrier gas supply means 142 is then increased by 10 sccm (10%), from 100 sccm to reach 110 sccm, in order to compensate for the decrease. Note that the correlation between the flow amount of the carrier gas and that of the produced material gas is evaluated in advance.

As a result, the amount of the material gas production is brought back to in-situ 10 sccm from 9 sccm due to the carrier gas increase. Since the change of the total gas-supply amount into the processing space S is not preferable on the other hand, the supplying flow amount of the carrier gas at the second carrier gas supply means 118 is at the same time decreased by 10 sccm that is equivalent of the amount increased in the carrier gas at the first carrier gas supply means 142. In other words, the gas-supply amount at the second carrier gas supply means 118 is decreased from 100 sccm to 90 sccm.

In this manner the total gas flow amount is maintained at 210 sccm constantly. In case of increase in the flow amount of the material gas, the reverse of the above flow-rate operation may be conducted.

Additionally, the carrier gas line 120 may be connected to the gas passage 6 on the downstream side of the gas flow detecting means 116 as shown by dashed lines.

Figure 12:
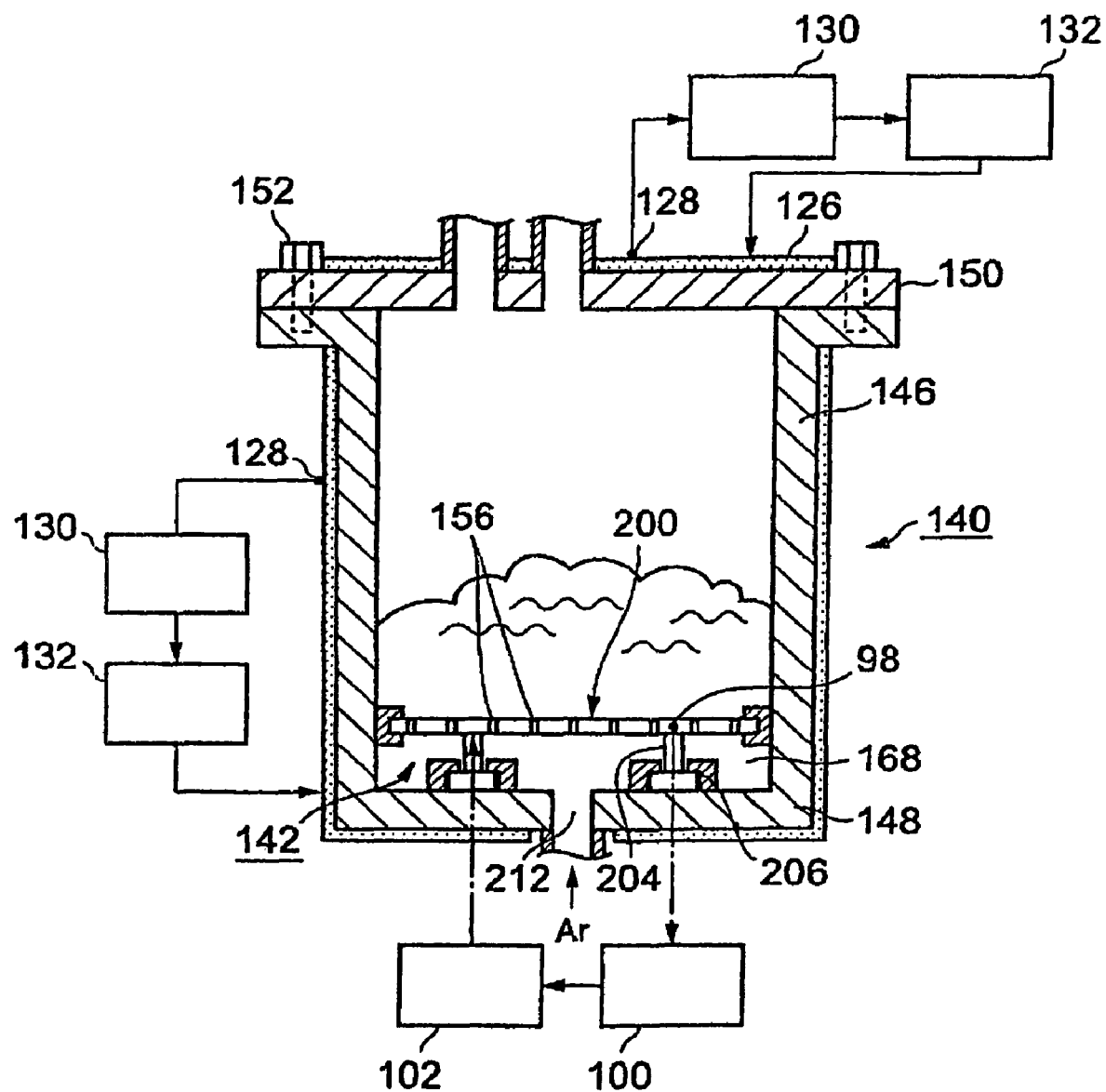
FIG. 12 is a cross-sectional view showing a modification of the material reservoir tank.

Note the material reservoir tank 140 may be structured as the modification shown in FIG. 12 to 14.

FIG. 12 is a cross-sectional view showing a modification of the material reservoir tank, FIG. 13 is an exploded diagram showing a part of the first carrier gas supply means at the bottom of the material reservoir tank and FIG. 14 is an enlarged cross-sectional view showing a configuration of the members of the part shown in FIG. 13. Note that the same reference characters are applied to the same portions as the structural components shown in FIG. 9 with their explanations omitted.

In this case, the side portion 146 and the bottom portion 148 of the material reservoir tank 140 are integrally formed of aluminum, and the first carrier gas supply means 142 is provided above the bottom portion 148. To be more specific, a ceramic with a resistance heater as a material heating means (not shown) implanted therein is shaped into a ceramic heater with a shape of a quite thin disc. For example, AlN or the like can be used for the ceramic. This disc-shaped ceramic heater is then provided with a number of gas injection holes 156 formed across the whole surface thereof to provide a shower portion 200. The circumference of this shower portion 200 incorporating the heater is held by a ring member 202 made of Teflon (a registered trademark) for example.

This shower portion 200 is supported on the bottom portion 148 by a plurality of top-shaped support members 204 which are hollow inside and have a specific height as shown in FIG. 13 and the struts 162 as shown in FIG. 10. These support members 204 are made of the same ceramic as the shower portion 200 and integrally formed with the shower portion 200 by pressurized firing. The base portion of each of the support members 204 is pressed by a pair of pressing members 206 featuring two half-circle shapes as shown in FIGS. 13 and 14, and each of these pressing members 206 is securely fixed to the bottom portion 148 with a bolt 210 via an O-ring 213 to provide airtight and stable fixation. At this point, the circumference of the bolt 210 is enclosed by an O-ring 211 to maintain the airtightness.

In the proximity of the shower portion 200, the thermocouple 98 is installed on the side of the ceiling portion of the hollow portion of the support member 204, and the electric feeder lines to the lead wires of the thermocouple 98 and the resistance heater are wired through the hollow portion of the hollow support member 204. Moreover, this hollow portion of the support member 204 is airtightly blocked from inside the material reservoir tank 140 and provides atmospheric air. Consequently, the maintenance of the thermocouple and the feeder lines is facilitated. In addition, the interspace between the shower portion 200 and the bottom portion 148 is structured as the gas diffusion chamber 168, and Ar gas as a carrier gas is fed from a gas inlet 212 provided in the bottom portion 148.

In this case, again, the material gas can be evenly produced and the flow amount thereof can be stabilized as in the example of the apparatus explained in FIG. 9.

In this case, in addition, the thermal efficiency can be increased because the resistance heater is incorporated and integrated in the shower portion 200. Furthermore, the temperature controllability of the heater can be improved as well because the support members 204 supporting the shower portion 200 are made of ceramic with low heat conductance and thus the heat is not very likely to be conducted to the side of the bottom portion 148.

Note that, also in this case, the surface of the shower portion 200 and the inner surface of the side portion 146 may be coated with a porous fluorinated resin layer, e.g. Teflon (a registered trademark).

Furthermore, the structure comprising the shower portion 200, ring member 202, support members 204, pressing members 206 etc. explained herein may be employed in the example of the apparatus shown in FIG. 1.

In the structure of the material reservoir tank 140 shown in FIGS. 9 and 12 on the other hand, in spite of the fact that the first gas outlet 176, an outlet for the evaporated gas (material gas) from the metallic compound material streaming toward the processing apparatus 22, is provided in the ceiling portion 150, not only the material gas but also fluid droplets (in a case that the metallic compound material is liquid), fine particles (in a case that the metallic compound material is solid), etc. may enter inside the first gas outlet 176 by the force of the carrier gas injected from the gas injection holes 156 of the bottom portion, flow directly through the gas passage 6 and get caught in the open/close valves 190, 192 (refer to FIG. 8), etc., thereby increasing risk of occlusion of the gas passage 6 itself etc.

Accordingly, as an modification of the material reservoir tank 140, a baffle plate member is provided to cover the gas outlet, i.e. the first gas outlet 176, connected to the gas passage 6 in order to prevent any metallic compound material other than gas from entering inside this first gas outlet 176.

Figure 15:
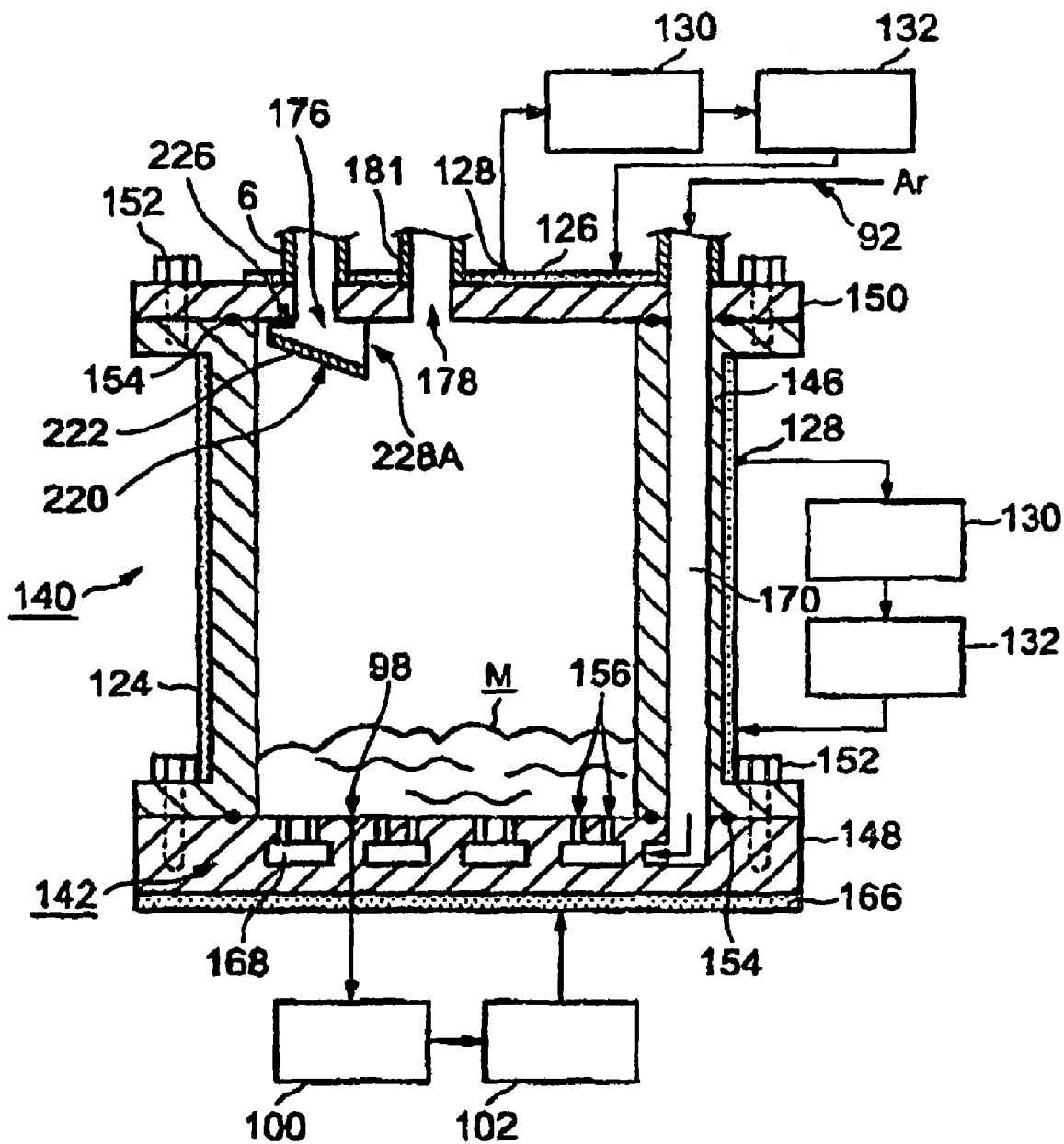
FIG. 15 is a cross-sectional view showing a modification of the material reservoir tank.
Figure 16:
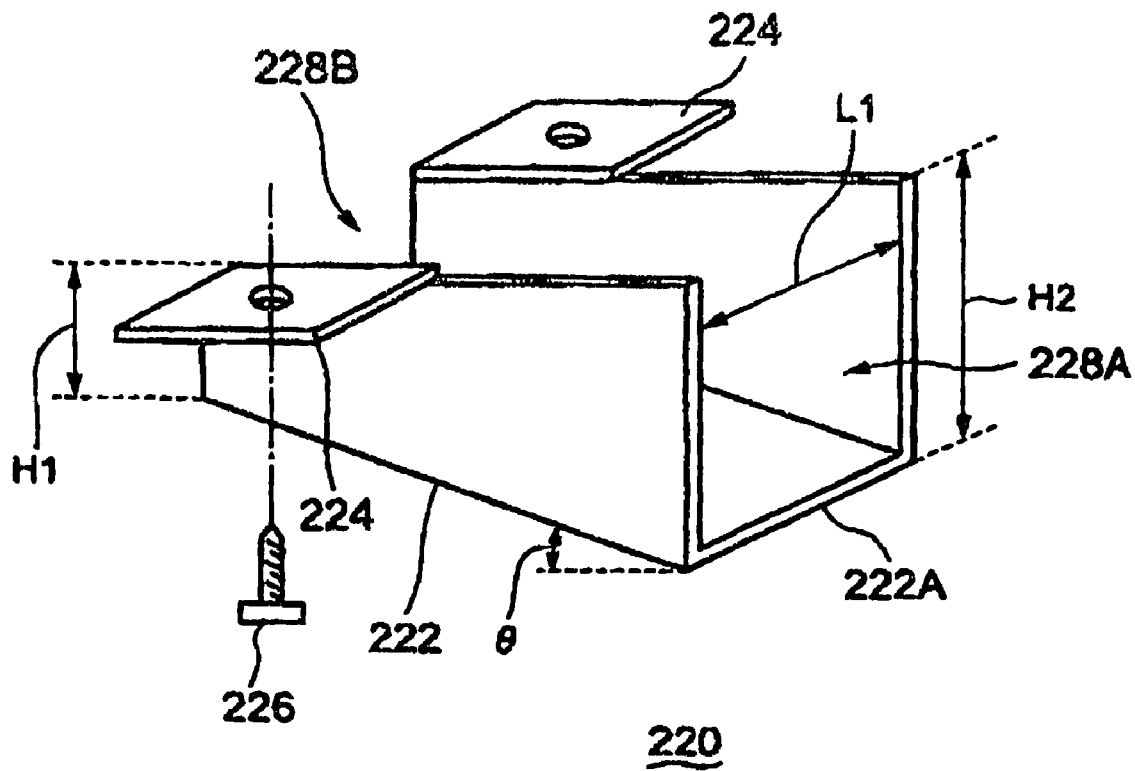
FIG. 16 is a perspective view showing an example of baffle plate member.

FIG. 15 is a cross-sectional view showing such a modification of the material reservoir tank, and FIG. 16 is a perspective view showing an example of the baffle plate member. Note that the same reference characters are applied to the same structural components as the structure shown in FIG. 9 with their explanations omitted. As shown diagrammatically, a baffle plate member 220 is provided inside the material reservoir tank 140 in a manner to cover the first gas outlet 176 to which the gas passage 6 is connected.

This baffle plate member 220 is constituted by a single bending plate 222 formed by folding a plate in a substantial U-shape in cross-section as shown in FIG. 16. To be more specific, this bending plate 222 is made of a material with good heat conductance, e.g. aluminum or copper, and bended into a substantial U-shape as described above. On both sides of the bending plate 222, a pair of attachment tabs 224 are provided in a horizontal direction, and these attachment tabs 224 are securely fastened to the inner surface of the ceiling portion 150 by bolts 226 for the bending plate 222 to be attached. At this point, this bending plate 222 is so attached as to locate the bottom portion 222A thereof substantially directly below the first gas outlet 176 and also is so provided as to incline at an angle of θ degrees relative to the horizontal, and thus droplets, particles, etc. of the metallic compound material M adhered to the bottom portion 222A are gathered in the direction of the inclination and come down by force of gravity. In addition, both ends of this bending plate 222 are formed as gas feed openings 228A, 228B for the gas rising from below.

In this case, the bending plate 222 is attached in a configuration that the surface of the metallic compound material M below cannot directly be seen from the first gas outlet 176 in order to prevent the droplets or particles (powdery material) blown up by the force of the carrier gas from entering inside the first gas outlet 176. At this point, the internal diameter of the first gas outlet 176 is approximately 17 mm, the width L1 of the bending plate 222 is approximately 24 mm, the lower height H1 is approximately 12 mm and the higher height H2 is approximately 23 mm.

When the baffle plate member 220 constituted by the bending plate 222 is provided in this way, even if a carrier gas is injected with great force from the gas injection holes 156 of the bottom portion inside the material reservoir tank 140 and the evaporated gas from the metallic compound material M is stirred up together with the droplets (in a case that the metallic compound material M is liquid) or particles or powdery material (in a case that the metallic compound material M is solid) of the metallic compound material M, these droplets or particles (powdery material) are adhered to the bending plate 222, removed, and thus prevented from entering inside the first gas outlet 176. Consequently, only the evaporated material gas, with the droplets or particles (powdery material) removed, flows into the first gas outlet 176 with the carrier gas.

In this case, the dimensions of both of the gas feed openings 228A, 228B formed in both sides of the bending plate 222 are quite large, and thus almost no pressure loss is generated in the metallic compound material M with low vapor pressure. Consequently, the material gas can smoothly be flown out together with the carrier gas as well as in the case that the baffle plate member 220 is not provided.

Moreover, the droplets or particles (powdery material) adhered to this bending plate 222 are actively gathered on one side of the bending plate 222 to be come down because the bottom portion 222A is provided with an inclination. Furthermore, since the bending plate 222 is made of a material with good heat conductance and thus the heat of the resistance heater 126 provided at the ceiling portion 150 is conducted to this bending plate 222 resulting in effective heating, the remaining droplets or particles (powdery material) on the bending plate 222 can also be effectively evaporated.

Figure 17:
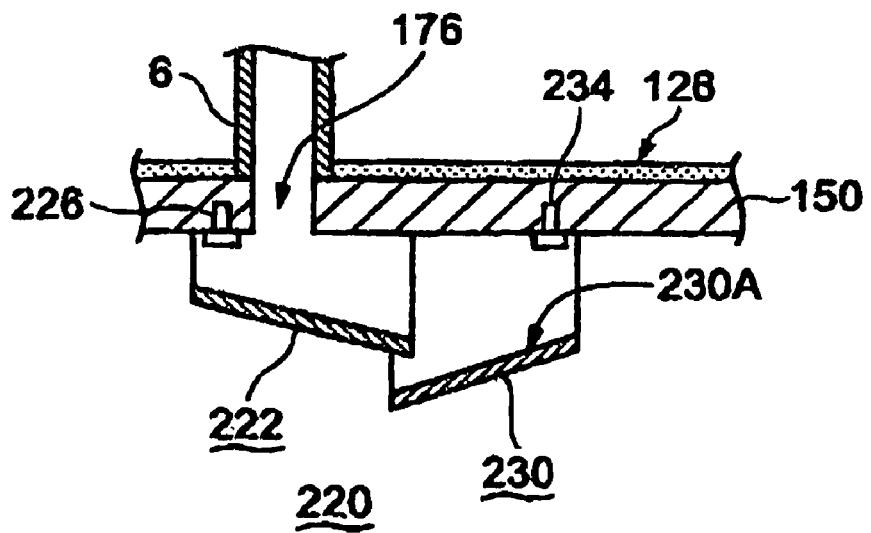
FIG. 17 is a partial cross-sectional view showing a baffle plate member using 2 bending plates.
Figure 18:
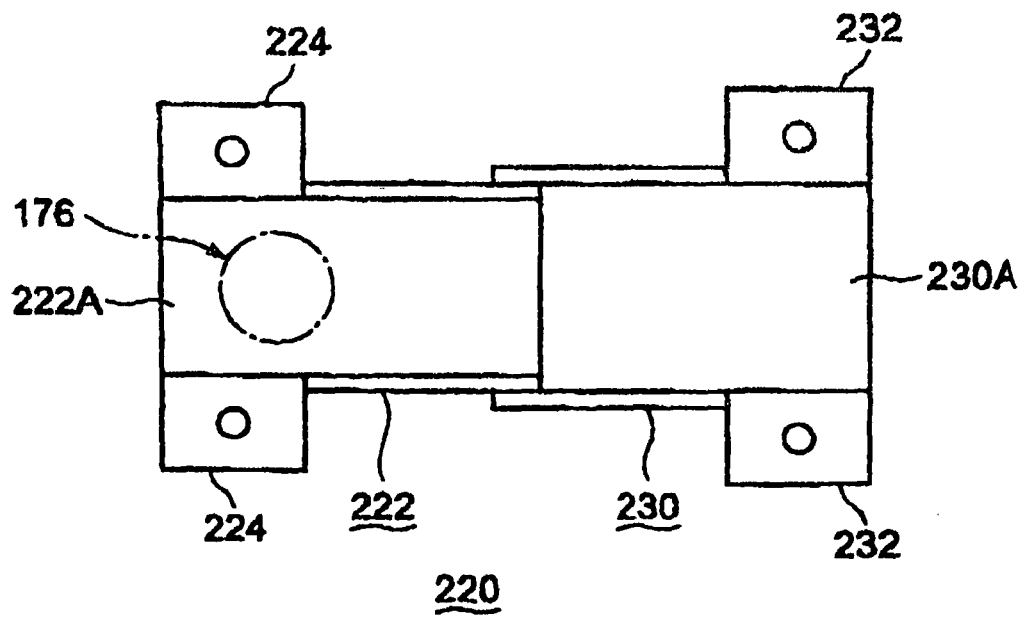
FIG. 18 is an enlarged plan view showing a configuration of the 2 bending plates.

Although a single bending plate 222 is used for the baffle plate member 220 shown in FIG. 16, the baffle plate member 220 is not limited to the above but may have an additional bending plate other than the bending plate 222. FIG. 17 is a partial cross-sectional view showing such a baffle plate member using 2 bending plates. FIG. 18 is an enlarged plan view showing a configuration of the 2 bending plates. As shown diagrammatically, a second bending plate 230 is used for the baffle plate member 220 in addition to the bending plate 222, wherein this bending plate 230 has the same form and structure as the bending plate 222 while only the dimension is set to be slightly larger. This bending plate 230, whose width and height are set to be slightly longer than the first bending plate 222 as mentioned above, is provided with attachment tabs 232 on both sides thereof, which are secured to the inner surface of the ceiling portion 150 by bolts 234 allowing attachment of the whole body. In this case, a bottom portion 230A of the bending plate 230 is provided also with an inclination at a specific angle relative to the horizontal, thus facilitating droplets or particles (powdery material) adhered thereto to become down. In addition, the bending plates 222, 230 are provided in a manner that one side of the lower-end portion of the bending plates 222 and that of the bending plate 230 are partially mutually inserted to fit together.

By providing the second bending plate 230 in this way, the droplets or particles (powdery material) of the metallic compound material M stirred up with a carrier gas can be adhered to the aforementioned 2 bending plates 222, 230 and removed, and thus these droplets or particles (powdery material) can more assuredly be prevented from entering the side of the first gas outlet 176 without increasing pressure loss.

Figures 19A, 19B:
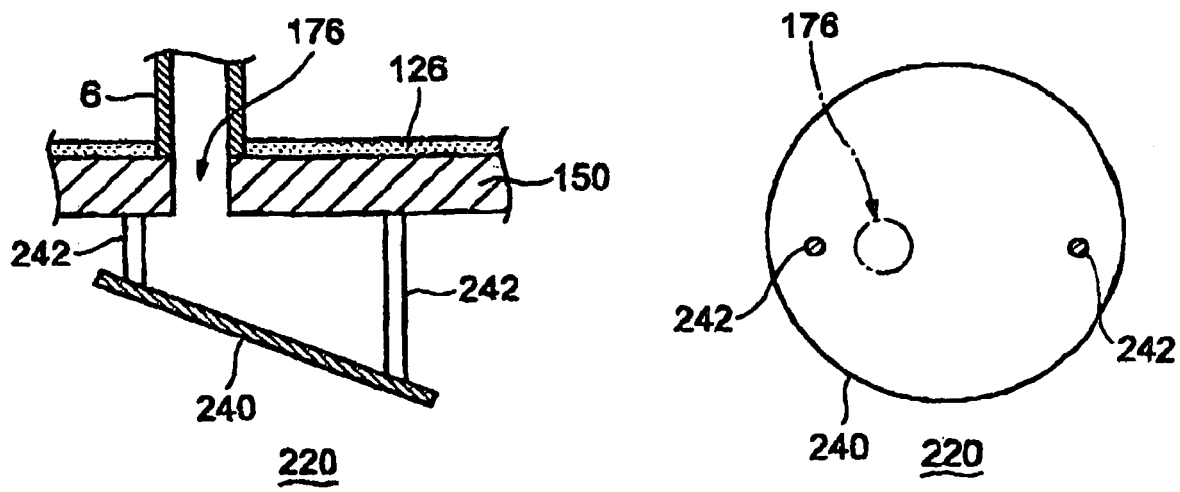
FIG. 19 is a diagram showing another modification of the baffle plate member.

Although, in the baffle plate members 220 explained above, bending plates 222, 230 bended in a substantial U-shape in cross section are employed, the baffle plate members 220 are not limited to the above but may be formed into a disc shape as shown in FIG. 19 or a cone shape as shown in FIG. 20, for example. That is, FIG. 19 is a diagram showing another modification of the baffle plate member, and FIG. 20 is a diagram showing yet another modification of the baffle plate member. FIG. 19(A) is a cross-sectional view showing the modification of the baffle plate member, and FIG. 19(B) is a plan view showing the modification of the baffle plate member.

For the baffle plate member 220 in this case, a disc plate 240 made of a material with good heat conductance is used such as Al and Cu as previously described and is securely fixed to the ceiling portion 150 by struts 242 in an inclined state at a specific angle relative to the horizontal. These struts 242 are also formed of a material with good heat conductance such as Al and Cu. In this case, instead of locating the center of the disc plate 240 directly above the first gas outlet 176, the part of the disc plate 240 slightly slanted upwardly in the direction of the inclination of the disc plate 240 is set to be located directly above the first gas outlet 176. In this structure, the droplets and particles (powder material) entering from the direction where the space between the ceiling portion 150 and the disc plate 240 is wider are prevented as much as possible from entering inside the first gas outlet 176. In this modification again, as in the baffle plate member shown in FIGS. 16 and 17, the droplets or particles (powdery material) of the metallic compound material M can be prevented from entering inside the first gas outlet 176 without generating pressure loss.

Figure 20A:
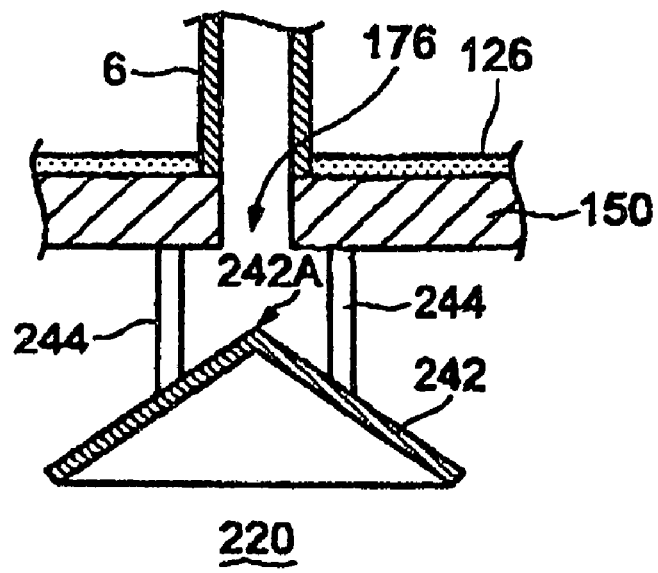
FIG. 20 is a diagram showing yet another modification of the baffle plate member.
Figure 20B:
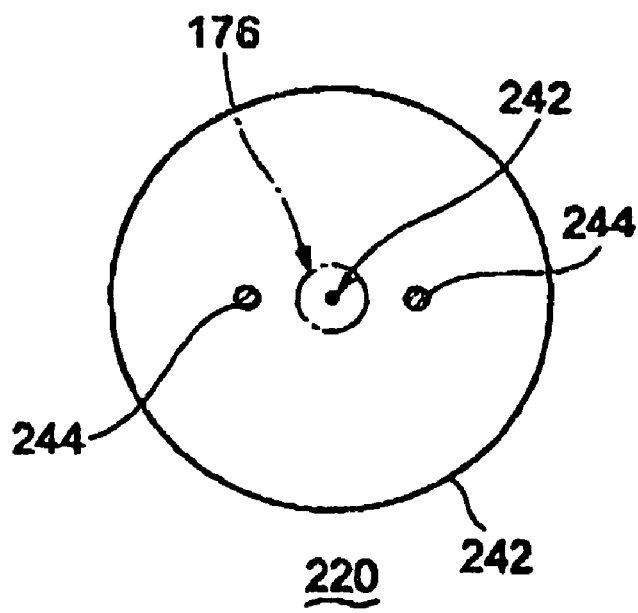

FIG. 20(A) is a cross-sectional view showing another modification of the baffle plate member, and FIG. 20(B) is a plan view showing the modification of the baffle plate member. For the baffle plate member 220 in this case, an umbrella-like conical plate 242 made of a material with good heat conductance is used such as Al and Cu as previously described and is securely fixed to the ceiling portion 150 by struts 244. These struts 244 are also formed of a material with good heat conductance such as Al and Cu. In this case, the apex 242A of the conical plate 242 is set to be located directly above the first gas outlet 176. In this structure, the droplets and particles (powder material) entering from the rim part where the space between the ceiling portion 150 and the conical plate 242 is wider are prevented as much as possible from entering inside the first gas outlet 176. In this modification again, as in the baffle plate member shown in FIGS. 16 and 17, the droplets or particles (powdery material) of the metallic compound material M can be prevented from entering inside the first gas outlet 176 without generating pressure loss.

Although each of the baffle plate members 220 in the above-mentioned structures is provided at the first gas outlet 176, this baffle plate member 220 may be provided at the second gas outlet 178 (refer to FIG. 9) to which the gas line 181 is connected. Moreover, each of the baffle plate members 220 explained herein may be provided at the material reservoir tank 140 shown in FIG. 12.

For the metallic compound material explained in each of the above embodiments, DMAT (dimethylaminotitanium), HTB (hafnium tertiary-butoxide), PET (pentaethoxy tantalum), DMAH (dimethylaluminum hydride), metal carbonyl compound, metallocene, metal beta-diketonate compound, $TaF_5$, $TaCl_5$, TMIn, etc. can be used.

For the carrier gas, other inert gas such as He gas, Xe gas, $N_2$ gas, etc. can be used for example, instead of Ar gas.

Although the above embodiments are explained by exemplifying the case wherein a film is formed on a semiconductor wafer which is employed as an object to be processed, the embodiments are not limited the above but can be applied to the case wherein a film is formed on a glass substrate, LCD substrate, etc. for example.

As explained above, the superior operational advantages can be achieved as stated below according to the gas supply system and processing system of the present invention.

According to the present invention, the produced material gas flow can be maintained at a specific amount because the carrier gas is designed to be injected from the whole surface of the bottom portion of the material reservoir tank in order to evaporate the metallic compound material so as to obtain the material gas.

In addition, the produced material gas flow amount can be controlled with high accuracy by changing the supplying flow amount of the carrier gas.

According to the present invention, the maintenance of the thermocouple and the feeder lines is facilitated because the hollow portion of the support member provides atmospheric air.

According to the present invention, the material reservoir tank is provided and directly attached to the processing vessel in the upper area of the processing apparatus, linked by the gas passage, and thus almost no pressure loss is generated during the material gas delivery, and the material gas can be effectively produced and effectively fed into the processing apparatus as a result.

According to the present invention, the liquid or solid metallic compound material can be prevented from flowing downwardly into the diffusion chamber below.

According to the present invention, the evaporation of the metallic compound material can be promoted due to the material heating means.

According to the present invention, by flowing a purge gas from the purge gas feed pipe while film formation is not performed, the purge gas can flow at a fast flow rate, thereby easily removing reaction by-products adhered to the showerhead portion and the interior of the processing vessel.

According to the present invention, the material gas flow can be maintained at a specific amount with high accuracy because the temperature of the material heating means is detected and the detected value is maintained at a specific value.

According to the present invention, the material gas flow can be maintained at a specific amount with high accuracy because the pressure inside the gas passage is detected to control the material heating means.

According to the present invention, the material gas flow can be maintained at a specific amount with high accuracy because the orifice means is provided to provide a sonic nozzle condition and the heat release amount of the material heating means and/or the supplying flow amount of the carrier gas are/is controlled so that the pressure inside the gas passage on the upstream side of the orifice means is maintained at a specific value.

According to the present invention, the material gas flow can be maintained at a specific amount with high accuracy because the partial pressure of the material gas inside the gas passage is detected and the heat release amount of the material heating means is controlled in order to maintain the detected pressure at a specific value.

According to the present invention, the material gas flow can be maintained at a specific amount with high accuracy because the gas flow amount inside the gas passage is detected and the heat release amount of the material heating means is controlled in order to maintain the detected amount at a specific value.

According to the present invention, the material gas flow can be maintained at a specific amount with high accuracy because the second carrier gas supply means is provided wherein the amount of the gas flowing inside the gas flow path is detected and the first carrier gas supply means is so controlled as to always maintain a constant flow amount of the material gas carried by the carrier gas from the first carrier gas supply means, and then the flow amount of the carrier gas increased or decreased by this control is compensated by the carrier gas from the second carrier gas supply means in order to constantly supply a specific amount of the total gas flow to the processing apparatus.

According to the present invention, by providing the baffle plate member at the gas outlet, the metallic compound material in the form of droplets or particles/powdery material except for gas can be prevented from flowing to the side of the processing apparatus without generating pressure loss.

The invention claimed is:

1. A gas supply method using a gas supply system which supplies a material gas produced from metallic compound material into a processing vessel having:
   a gas passage extending to said processing vessel;
   a material reservoir tank for containing said metallic compound material therein;
   a heating means provided in said material reservoir tank for evaporating said metallic compound material;
   a first carrier gas supply means for feeding a carrier gas into said material reservoir tank; and
   a detecting means for detecting a condition inside said gas passage,
   said method comprising a step of controlling a temperature of said heating means or controlling a gas flow amount of said carrier gas in response to a value detected by said detecting means,
   wherein said first carrier gas supply means comprises a gas diffusion chamber provided in said material reservoir tank, and a gas injection plate separating said gas diffusion chamber and having a number of gas injection holes.

2. A gas supply method as described in claim 1, wherein said heating means is implanted in said gas injection plate.

3. A gas supply method as described in claim 2, wherein said gas injection plate is a ceramic with a resistance heater implanted therein.

4. A gas supply method as described in claim 1, wherein said detecting means detects the amount of gas flowing through said gas passage.

5. A gas supply method as described in claim 4, wherein
   said gas supply system further comprises a second carrier gas supply means for feeding a carrier gas into said gas passage, and
   said method further comprises controlling by said first carrier gas supply means, the carrier gas flow amount so that the flow amount of the material gas within said gas passage is maintained at a constant amount, and controlling by said second carrier gas supply means, the carrier gas flow amount so that the total gas flow amount supplied into said processing vessel is maintained at a constant amount.

6. A gas supply method as described in claim 5, comprising detecting a change of the gas flow amount of the material gas by said detecting means as a change of its detected value.

7. A gas supply method as described in claim 5, comprising changing by said first carrier gas supply means, the carrier gas flow amount in order to compensate a change of the flow amount of the material gas within said gas passage, while changing by said second carrier gas supply means, its carrier gas flow amount in order to cancel the gas flow amount increased or decreased by said first carrier gas supply means.

8. A gas supply method as described in claim 1, comprising detecting by said detecting means, the pressure inside said gas passage.

9. A gas supply method as described in claim 4, comprising detecting by said detecting means, a partial pressure of the material gas inside said gas passage with a spectrum of the material gas.

* * * * *